United States Patent
Yamashita

(10) Patent No.: US 12,310,013 B2
(45) Date of Patent: May 20, 2025

(54) NON-VOLATILE MEMORY DEVICE

(71) Applicant: KIOXIA CORPORATION, Tokyo (JP)

(72) Inventor: Hiroki Yamashita, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/657,854

(22) Filed: May 8, 2024

(65) Prior Publication Data
US 2024/0292611 A1 Aug. 29, 2024

Related U.S. Application Data

(63) Continuation of application No. 18/322,306, filed on May 23, 2023, now Pat. No. 12,022,652, which is a
(Continued)

(51) Int. Cl.
| | |
|---|---|
| H10B 41/27 | (2023.01) |
| H01L 29/423 | (2006.01) |
| H01L 29/51 | (2006.01) |
| H01L 29/788 | (2006.01) |
| H10B 41/10 | (2023.01) |
| H10B 41/35 | (2023.01) |
| H10B 43/10 | (2023.01) |
| H10B 43/27 | (2023.01) |
| H10B 43/35 | (2023.01) |

(52) U.S. Cl.
CPC ....... *H10B 41/27* (2023.02); *H01L 29/42328* (2013.01); *H01L 29/512* (2013.01); *H01L 29/788* (2013.01); *H10B 41/10* (2023.02); *H10B 41/35* (2023.02); *H10B 43/10* (2023.02); *H10B 43/27* (2023.02); *H10B 43/35* (2023.02)

(58) Field of Classification Search
CPC ........ H10B 41/27; H10B 41/10; H10B 43/35; H10B 41/35; H10B 43/10; H10B 43/27; H01L 29/42328; H01L 29/512; H01L 29/788
USPC .......................................................... 257/316
See application file for complete search history.

(56) References Cited

U.S. PATENT DOCUMENTS

| | | | |
|---|---|---|---|
| 5,392,237 A | 2/1995 | Iida | |
| 6,674,470 B1 * | 1/2004 | Tanaka | H04N 25/51 |
| | | | 348/E3.018 |

(Continued)

*Primary Examiner* — Jami Valentine Miller
(74) *Attorney, Agent, or Firm* — Oblon, McClelland, Maier & Neustadt, L.L.P.

(57) ABSTRACT

According to one embodiment, a non-volatile memory device includes electrodes, an interlayer insulating film, at least one semiconductor layer, conductive layers, first and second insulating films. The electrodes are arranged in a first direction. The interlayer insulating film is provided between the electrodes. The semiconductor layer extends in the first direction in the electrodes and the interlayer insulating film. The conductive layers are provided between each of the electrodes and the semiconductor layer, and separated from each other in the first direction. The first insulating film is provided between the conductive layers and the semiconductor layer. The second insulating film is provided between each of the electrodes and the conductive layers, and extends between each of the electrodes and the interlayer insulating film adjacent to the each of the electrodes. A width of the conductive layers in the first direction is narrower than that of the second insulating film.

20 Claims, 16 Drawing Sheets

Related U.S. Application Data continuation of application No. 17/513,826, filed on Oct. 28, 2021, now Pat. No. 11,700,728, which is a continuation of application No. 16/785,446, filed on Feb. 7, 2020, now Pat. No. 11,195,843, which is a continuation of application No. 16/591,433, filed on Oct. 2, 2019, now Pat. No. 10,593,686, which is a continuation of application No. 15/957,167, filed on Apr. 19, 2018, now Pat. No. 10,468,429, which is a continuation of application No. 15/678,853, filed on Aug. 16, 2017, now Pat. No. 9,978,767, which is a continuation of application No. 15/414,110, filed on Jan. 24, 2017, now Pat. No. 9,773,797, which is a continuation of application No. 14/483,259, filed on Sep. 11, 2014, now Pat. No. 9,627,391.

(60) Provisional application No. 62/023,031, filed on Jul. 10, 2014.

(56) References Cited

U.S. PATENT DOCUMENTS

| | | | |
|---|---|---|---|
| 8,415,674 B2 | 4/2013 | Lim et al. | |
| 8,426,976 B2 | 4/2013 | Ishiduki et al. | |
| 8,766,351 B2 | 7/2014 | Imamura et al. | |
| 2002/0175364 A1* | 11/2002 | Ichige | H10B 41/35 257/314 |
| 2004/0152262 A1* | 8/2004 | Ichige | H01L 27/0207 438/257 |
| 2005/0045966 A1* | 3/2005 | Yamashita | H10B 41/30 257/524 |
| 2010/0148237 A1 | 6/2010 | Kito | |
| 2010/0207185 A1 | 8/2010 | Lee | |
| 2010/0240205 A1 | 9/2010 | Son | |
| 2011/0244666 A1* | 10/2011 | Kim | H10B 41/20 438/587 |
| 2011/0284817 A1 | 11/2011 | Sasago | |
| 2011/0298037 A1* | 12/2011 | Choe | G11C 16/0483 257/314 |
| 2012/0001247 A1 | 1/2012 | Alsmeier | |
| 2012/0132981 A1 | 5/2012 | Imamura et al. | |
| 2013/0059426 A1 | 3/2013 | Yamashita | |
| 2013/0250676 A1* | 9/2013 | Hishida | H10B 43/35 257/E21.004 |
| 2014/0001544 A1* | 1/2014 | Sato | H01L 29/42344 438/270 |
| 2014/0252450 A1 | 9/2014 | Imamura et al. | |
| 2014/0264532 A1 | 9/2014 | Dennison et al. | |
| 2016/0268285 A1* | 9/2016 | Okamoto | H01L 27/092 |

* cited by examiner

NON-VOLATILE MEMORY DEVICE

CROSS-REFERENCE TO RELATED APPLICATIONS

This application is a continuation of and claims benefit under 35 U.S.C. § 120 to U.S. application Ser. No. 18/322,306, filed May 23, 2023, which is a continuation of and claims benefit under 35 U.S.C. § 120 to U.S. application Ser. No. 17/513,826, filed Oct. 28, 2021 (now U.S. Pat. No. 11,700,728), which is a continuation of and claims benefit under 35 U.S.C. § 120 to U.S. application Ser. No. 16/785,446, filed Feb. 7, 2020 (now U.S. Pat. No. 11,195,843), which is a continuation of and claims benefit under 35 U.S.C. § 120 to U.S. application Ser. No. 16/591,433, filed Oct. 2, 2019 (now U.S. Pat. No. 10,593,686), which is a continuation of and claims benefit under 35 U.S.C. § 120 to U.S. application Ser. No. 15/957,167, filed Apr. 19, 2018 (now U.S. Pat. No. 10,468,429), which is a continuation of and claims benefit under 35 U.S.C. § 120 to U.S. application Ser. No. 15/678,853, filed Aug. 16, 2017 (now U.S. Pat. No. 9,978,767), which is a continuation of and claims benefit under 35 U.S.C. § 120 to U.S. application Ser. No. 15/414,110, filed Jan. 24, 2017 (now U.S. Pat. No. 9,773,797), which is a continuation of and claims benefit under 35 U.S.C. § 120 to U.S. application Ser. No. 14/483,259, filed Sep. 11, 2014 (now U.S. Pat. No. 9,627,391), which is a continuation of and claims benefit from U.S. Provisional Patent Application 62/023,031, filed Jul. 10, 2014, the entire contents of each of which are incorporated herein by reference.

FIELD

Embodiments described herein relate generally to a non-volatile memory device.

BACKGROUND

In order to realize a next-generation non-volatile memory device, the development of a memory cell array having a three-dimensional structure has been advanced. The memory cell array having a three-dimensional structure includes a plurality of word lines stacked and a memory cell formed inside a memory hole piercing the stacked word lines. In such a non-volatile memory device, the improvement of the retention property of the memory cell is demanded.

DETAILED DESCRIPTION

Figure 1:
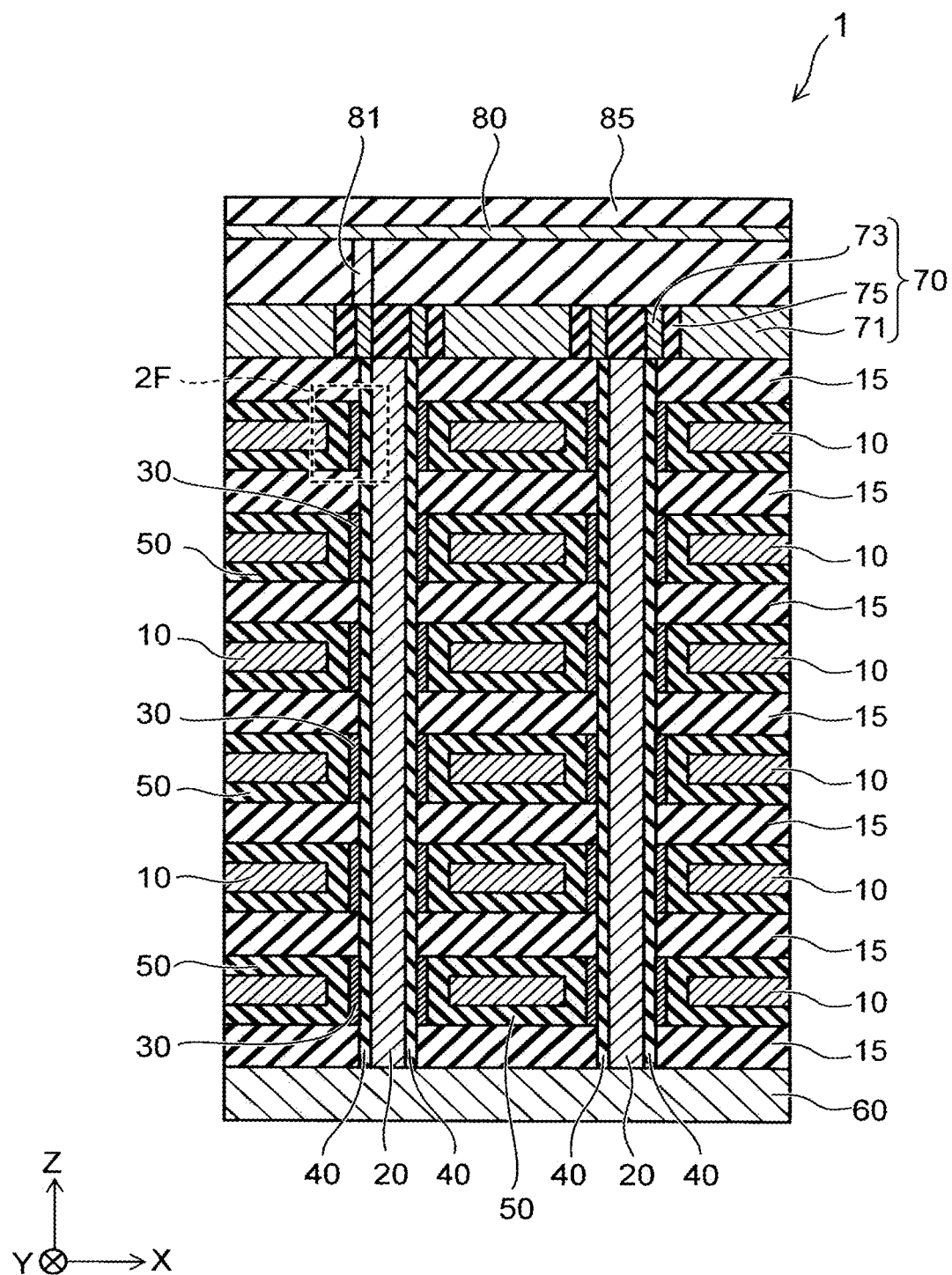
FIG. 1 is a schematic cross-sectional view illustrating a non-volatile memory device according to a first embodiment.

According to one embodiment, a non-volatile memory device includes electrodes, an interlayer insulating film, at least one semiconductor layer, conductive layers, a first insulating film, and a second insulating film. The electrodes are arranged in a first direction. The interlayer insulating film is provided between the electrodes. The at least one semiconductor layer extends in the first direction in the electrodes and the interlayer insulating film. The conductive layers are provided between each of the electrodes and the semiconductor layer, and separated from each other in the first direction. The first insulating film is provided between the conductive layers and the semiconductor layer. The second insulating film is provided between each of the electrodes and the conductive layers, and extends between each of the electrodes and the interlayer insulating film adjacent to the each of the electrodes. A width of the conductive layers in the first direction is narrower than a width of the second insulating film in the first direction.

Various embodiments will be described hereinafter with reference to the accompanying drawings. In the drawings, identical portions are marked with like reference numerals, and a detailed description thereof will be omitted as appropriate, and different portions will be described. Incidentally, the drawings are schematic or conceptual, and the relationship between the thickness and width of each portion, the ratio of sizes among portions, etc., are not necessarily the same as the actual ones. Further, the dimensions and ratios may sometimes be illustrated differently among the drawings even for identical portions. The arrangement of each element may sometimes be described using the direction of X, Y, or Z axis shown in the drawings. The X, Y, and Z axes are orthogonal to one another, and the Z-axis direction may sometimes be expressed as "upper side", and the opposite direction thereto may sometimes be expressed as "lower side".

First Embodiment

FIG. 1 is a schematic cross-sectional view illustrating a non-volatile memory device 1 according to a first embodiment. The non-volatile memory device 1 shown in FIG. 1 is one example, and the embodiment is not limited thereto.

The non-volatile memory device 1 includes a plurality of electrodes (hereinafter referred to as "control gates 10") arranged in a first direction (hereinafter referred to as "Z-direction") and at least one semiconductor layer (hereinafter referred to as "channel body 20"). The channel body 20 extends in the Z-direction in the control gates 10.

The control gates 10 are arranged side by side in the Z-direction through, for example, an interlayer insulating film 15. The control gate 10 and the interlayer insulating film 15 are alternately arranged in the Z-direction. The channel body 20 is provided, for example, inside a memory hole 17 piercing the control gates 10 and the interlayer insulating films 15 in the Z-direction (see FIG. 3B).

The non-volatile memory device 1 includes a conductive layer 30, a first insulating film 40, and a second insulating film 50 between each of the control gates 10 and the channel body 20. The conductive layer 30 is provided between the first insulating film 40, and the second insulating film 50. The conductive layers 30 are provided so as to be separated from each other in the Z-direction.

The first insulating film 40 extends between the channel body 20 and the conductive layers 30 in the Z-direction, for example, along the channel body 20. The first insulating film 40 is in contact with, for example, the conductive layers 30. The second insulating film 50 is provided between each of the control gates 10 and the conductive layer 30.

As shown in FIG. 1, the control gates 10 are provided on a source interconnection 60. The source interconnection 60 is provided on a silicon substrate (not shown) through, for example, an interlayer insulating film. The channel body 20 is electrically connected to the source interconnection 60.

On the uppermost layer in the Z-direction among the control gates 10, a selection transistor 70 is provided through the interlayer insulating film 15. The selection transistor 70 includes a selection gate 71, a channel body 73, and a gate insulating film 75. The channel body 73 is electrically connected to the channel body 20. The gate insulating film 75 is provided between the selection gate 71 and the channel body 73.

Further, on the selection transistor 70, a bit line 80 is provided. The bit line 80 is electrically connected to the channel body 73 through a contact plug 81. The bit line 80 is electrically connected to the channel body 20 through the selection transistor 70.

The selection transistor 70 performs the ON/OFF control of electrical connection between the channel body 20 and the bit line 80. A selection transistor which performs the ON/OFF control of electrical connection between the source interconnection 60 and the channel body 20 may be provided between the lowermost control gate 10 and the source interconnection 60.

Figure 2:
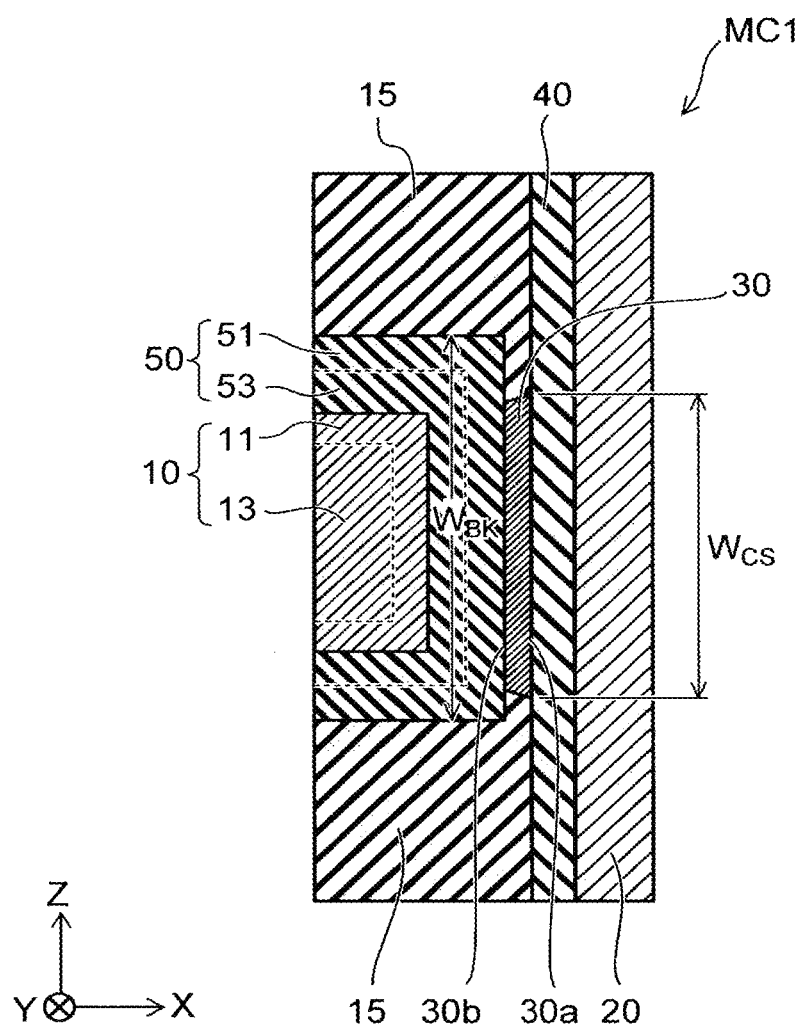
FIG. 2 is a schematic view illustrating a memory cell according to the first embodiment.

FIG. 2 is a schematic view illustrating a memory cell MC1 according to the first embodiment. FIG. 2 is a schematic cross-sectional view showing the memory cell MC1 by enlarging a region 2F shown in FIG. 1.

As shown in FIG. 2, between the control gate 10 and the channel body 20, the conductive layer 30, the first insulating film 40, and the second insulating film 50 are disposed. Between the control gate 10 and the channel body 20, a floating gate type memory cell MC1 is formed. The memory cell MC1 includes the conductive layer 30, the first insulating film 40, and the second insulating film 50. The conductive layer 30 functions, for example, as a charge storage layer. The first insulating film 40 functions, for example, as a tunnel insulating film. The second insulating film 50 functions, for example, as a block insulating film.

In the embodiment, the conductive layers 30 are formed so as to be separated from each other in the Z-direction. According to this configuration, charge transfer between the memory cells MC1 disposed along the channel body 20 is prevented so that the retention property can be improved.

Further, the conductive layer 30 is formed such that the width $W_{CS}$ of the conductive layer 30 in the Z-direction is narrower than the width $W_{BK}$ of the second insulating film 50 in the Z-direction. That is, the conductive layer 30 is formed such that the both ends of the conductive layer 30 in the Z-direction come closer to the control gate. According to this configuration, the controllability of the charge stored at the both ends of the conductive layer 30 can be improved.

The conductive layer 30 has a first face 30*a* in contact with the first insulating film 40 and a second face 30*b* in contact with the second insulating film 50. The length of the first face 30*a* in the Z-direction is longer than the length of the second face 30*b* in the Z-direction.

The control gate 10 has a stacked structure including, for example, a first layer 11 and a second layer 13. The first layer 11 is located between the second layer 13 and the second insulating film 50. The first layer 11 is, for example, titanium nitride (TiN). The second layer 13 is, for example, tungsten (W). The first layer 11 functions as a barrier layer that prevents metal atoms contained in the second layer 13 from diffusing into the conductive layer 30, the first insulating film 40, and the second insulating film 50.

The second insulating film 50 may be a stacked film including, for example, a first film 51 and a second film 53. The first film 51 is located between the conductive layer 30 and the second film 53. The second film 53 is located between the control gate 10 and the first film 51.

The first film 51 has a dielectric constant different from that of the second film 53. For example, the dielectric constant of the first film 51 is set higher than the dielectric constant of the second film 53. According to this configuration, for example, the electric field of the conductive layer 30 is decreased, and the dielectric breakdown voltage of the second insulating film 50 can be improved.

Next, with reference to FIGS. 3A to 11C, a method for manufacturing the non-volatile memory device 1 according to the first embodiment will be described. FIGS. 3A to 11C are schematic views illustrating a process for manufacturing the non-volatile memory device 1.

Figure 3A:
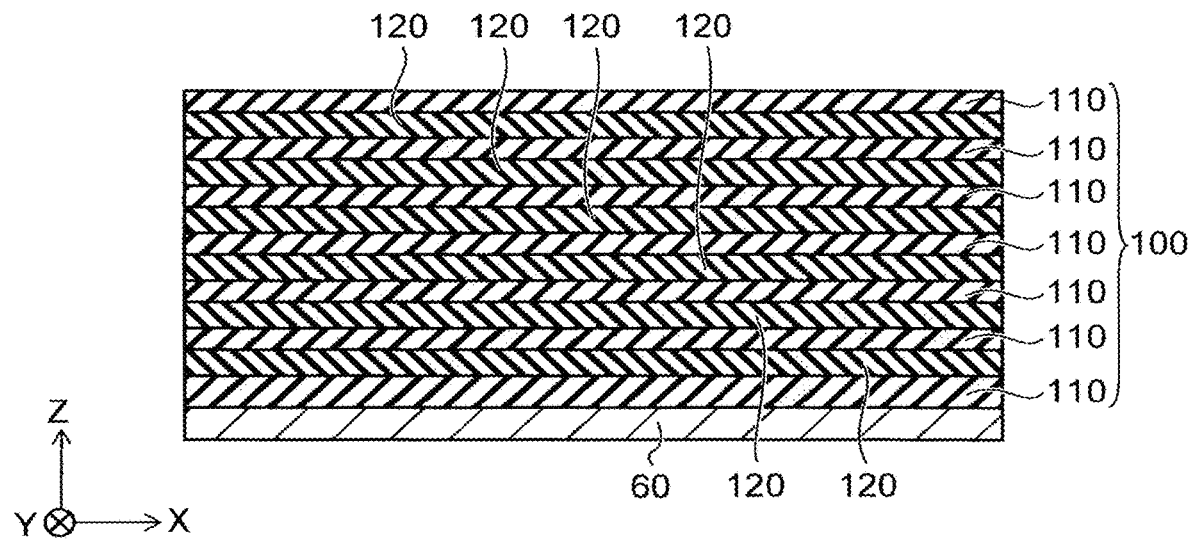
FIGS. 3A to 11C are schematic views illustrating a process for manufacturing the non-volatile memory device according to the first embodiment.

FIG. 3A is a schematic view showing the cross section of a stacked body 100 formed on the source interconnection 60. For example, on the source interconnection 60, a first sacrifice film 110 and a second sacrifice film 120 are alternately stacked in the Z-direction. According to this configuration, the stacked body 100 including a plurality of the first sacrifice films 110 and a plurality of the second sacrifice films 120 is formed.

The first sacrifice film 110 is formed using a material different from that for the second sacrifice film 120. For the first sacrifice film 110, for example, any of a silicon oxide film, a silicon nitride film, and a polycrystalline silicon (polysilicon) film can be used. For the second sacrifice film 120, for example, any of a silicon oxide film, a silicon nitride film, and a polysilicon film can be used, however, the material is different from that for the first sacrifice film 110. The first sacrifice film 110 and the second sacrifice film 120 can be successively formed by using, for example, a CVD (Chemical Vapor Deposition) method.

Figure 3B:
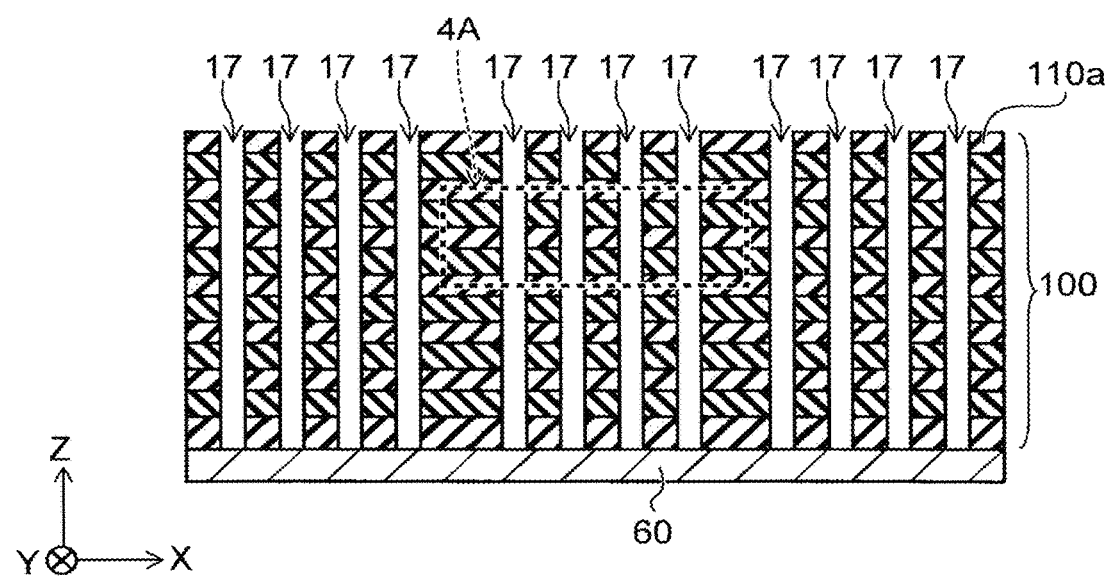

As shown in FIG. 3B, a memory hole 17 piercing the stacked body 100 in the Z-direction is formed. The memory hole 17 is formed, for example, so as to communicate with the source interconnection 60 from the uppermost first sacrifice film 110*a*. The memory hole 17 is formed by selectively etching the first sacrifice films 110 and the second sacrifice films 120 by, for example, RIE (Reactive Ion Etching).

FIG. 4A to FIG. 11C described below are schematic cross-sectional views showing a region 4A shown in FIG. 3B. FIGS. 4A, 5A, 6A, 7A, 8A, 9A, 10A, and 11A are partial cross-sectional views parallel to the X-Z plane, and FIGS. 4B, 5B, 6B, 6C, 7B, 7C, 8B, 8C, 9B, 9C, 10B, 10C, 11B, and 11C are plan views parallel to the X-Y plane.

Figure 4A:
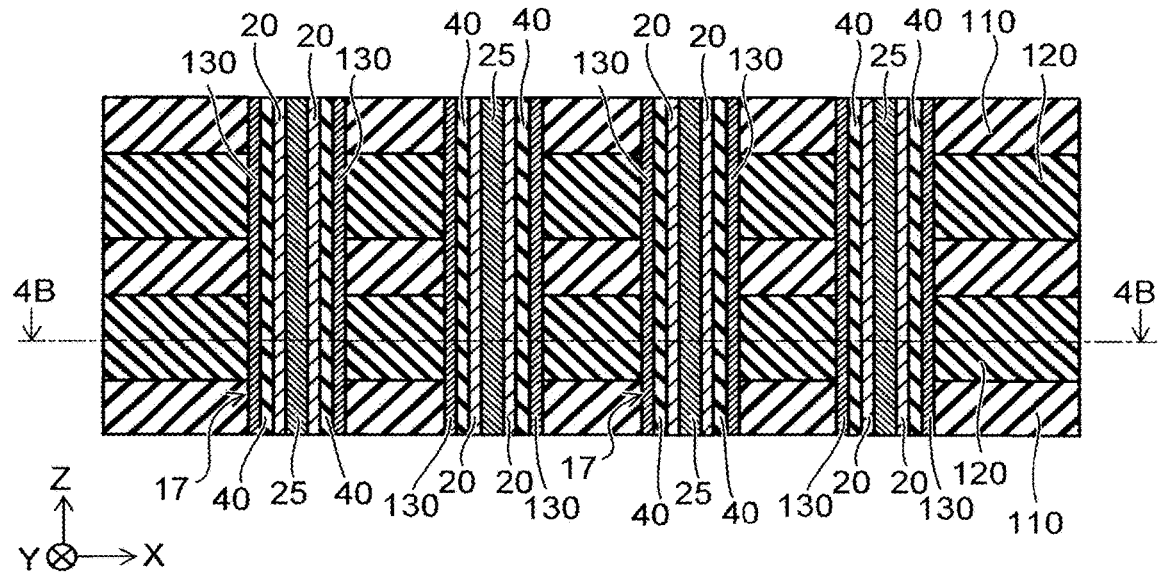

As shown in FIG. 4A, the channel body 20, the first insulating film 40, and the conductive film 130 are formed inside the memory hole 17. Specifically, on the inner wall of the memory hole 17, the conductive film 130, the first insulating film 40, and the channel body 20 are formed in this order. Further, a core 25 which is embedded inside the memory hole 17 may be formed inside the channel body 20.

The conductive film 130 is, for example, any one of a conductive film containing silicon, a metal film, and a conductive film containing a metal oxide. Examples of the conductive film containing silicon may include a polysilicon film. Examples of the metal film may include a tungsten film. Further, examples of the metal oxide may include ruthenium oxide.

As the first insulating film 40, for example, a silicon oxide film or a silicon oxynitride film is used. Further, the first insulating film 40 may have a stacked structure of, for example, a silicon oxide film/a silicon nitride film/a silicon oxide film. As the channel body 20, for example, polysilicon can be used. The core 25 has an insulating property, and is, for example, a silicon oxide film. The conductive film 130, the first insulating film 40, and the channel body 20 are formed by using, for example, a CVD method or a PCVD method (Plasma Enhanced Chemical Vapor Deposition) method.

Figure 4B:
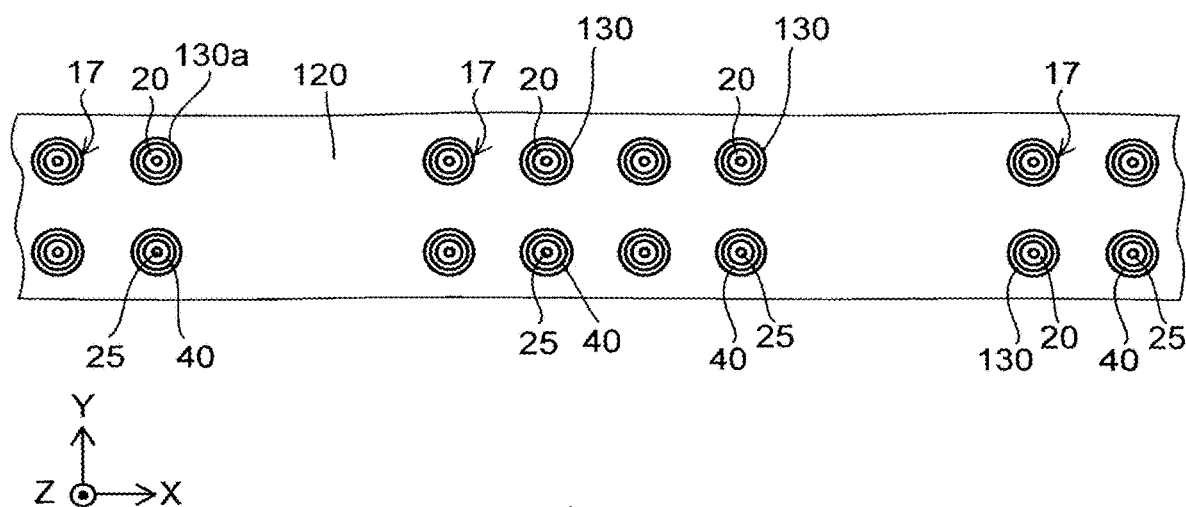

FIG. 4B is a cross-sectional view taken along the line 4B-4B shown in FIG. 4A. As shown in FIG. 4B, the memory hole 17 has, for example, a circular cross-section. The conductive film 130, the first insulating film 40, and the channel body 20 are formed, for example, concentrically along the inner surface of the memory hole 17.

Figure 5A:
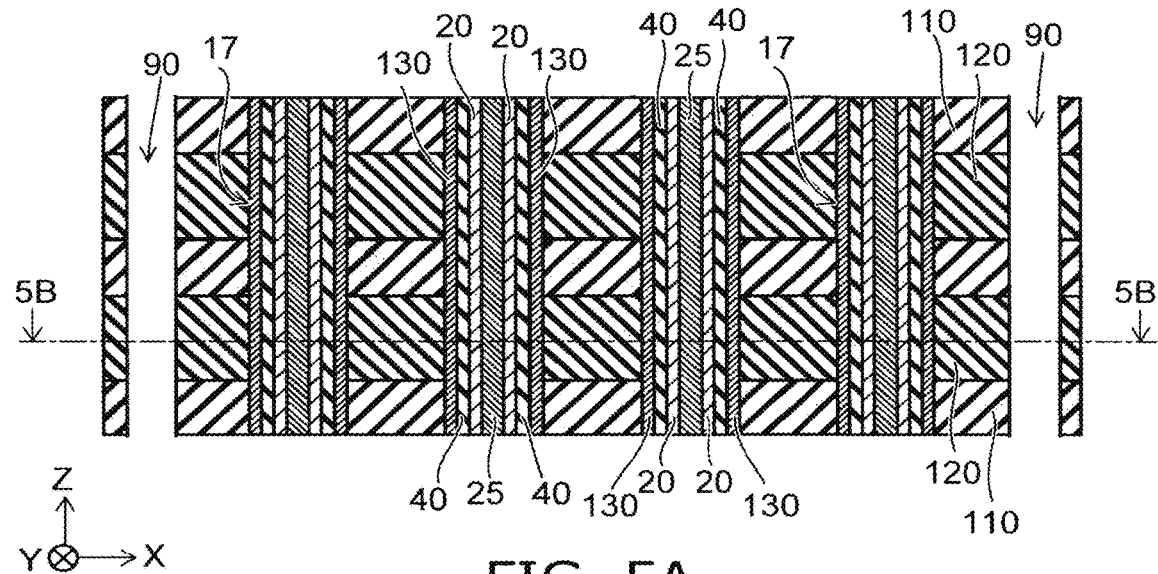
Figure 5B:
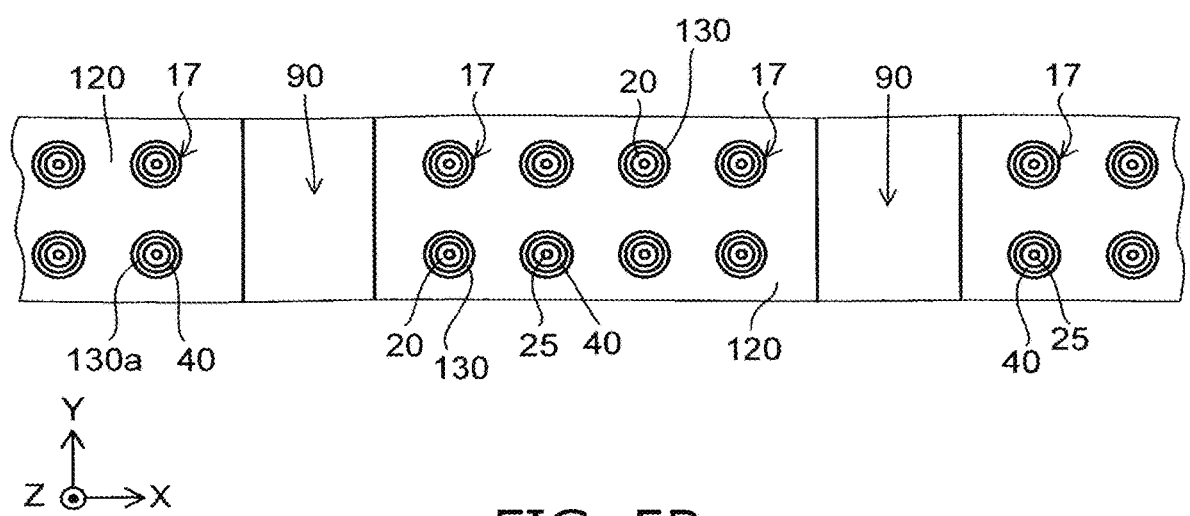

As shown in FIGS. 5A and 5B, a slit 90 is formed. FIG. 5B is a cross-sectional view taken along the line 5B-5B shown in FIG. 5A. The slit 90 is a groove having a depth reaching the source interconnection 60 from the uppermost first sacrifice film 110a. The slit 90 extends in the Y-direction.

The slit 90 divides the stacked body 100 into a plurality of portions in a region excluding the memory hole 17 of the stacked body 100. The slit 90 is formed by selectively etching the first sacrifice film 110 and the second sacrifice film 120 by using, for example, RIE.

Figure 6A:
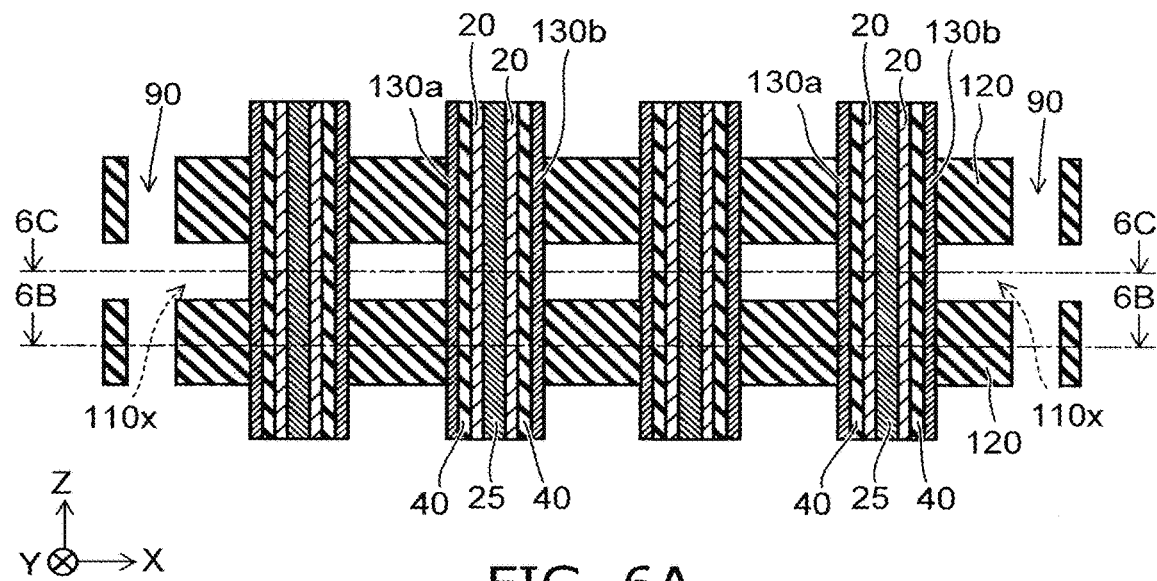
Figure 6B:
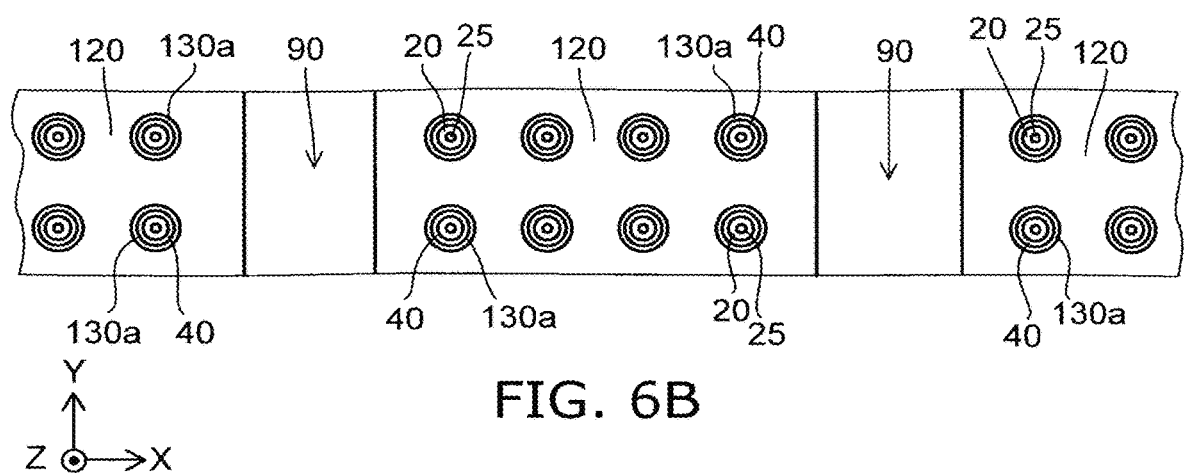
Figure 6C:
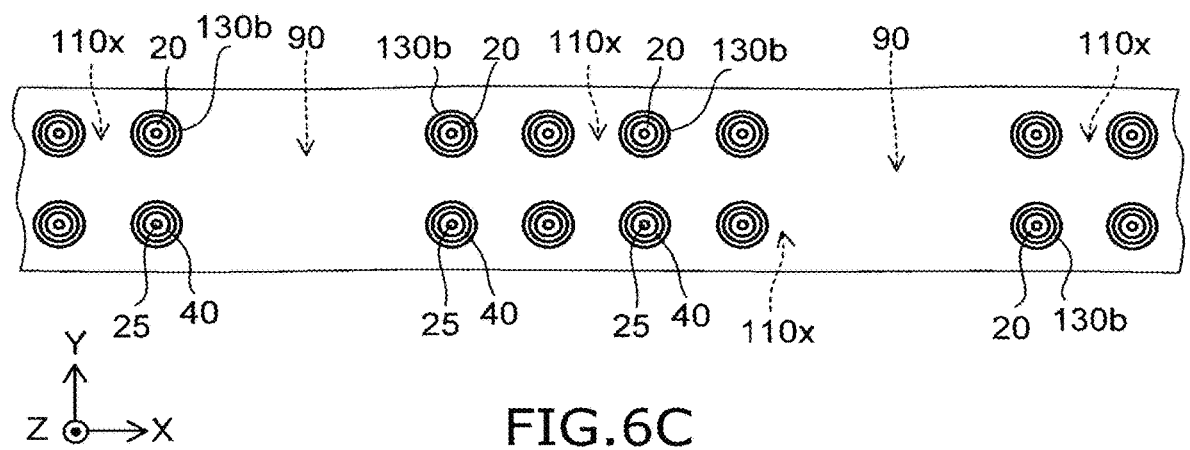

As shown in FIGS. 6A to 6C, through the slit 90, the first sacrifice film 110 is selectively removed. FIG. 6B is a cross-sectional view taken along the line 6B-6B shown in FIG. 6A. FIG. 6C is a cross-sectional view taken along the line 6C-6C shown in FIG. 6A.

For example, as the first sacrifice film 110, a silicon oxide film is used, and as the second sacrifice film 120, a silicon nitride film is used. The conductive film 130 is, for example, a polysilicon film. The conductive film 130 is in contact with the first sacrifice film 110 in the inner wall of the memory hole 17. The first sacrifice film 110 can be selectively removed by wet etching using, for example, hydrofluoric acid (HF). That is, hydrofluoric acid etches the silicon oxide film, but does not etch the silicon nitride film and the polysilicon.

For example, the silicon nitride film can be selectively removed with respect to the silicon oxide film and the polysilicon by using hot phosphoric acid as an etching solution. The polysilicon can be selectively removed with respect to the silicon oxide film and the silicon nitride film by using an alkaline chemical solution (for example, potassium hydroxide KOH) as an etching solution. Further, by using CDE (Chemical Dry Etching), the silicon oxide film or the silicon nitride film can be selectively removed.

As shown in FIGS. 6B to 6C, the conductive film 130 has a first portion 130a and a second portion 130b. The first portion 130a is located between the second sacrifice film 120 and the first insulating film 40. The second portion 130b is exposed to a space 110x where the first sacrifice film 110 is removed.

Figure 7A:
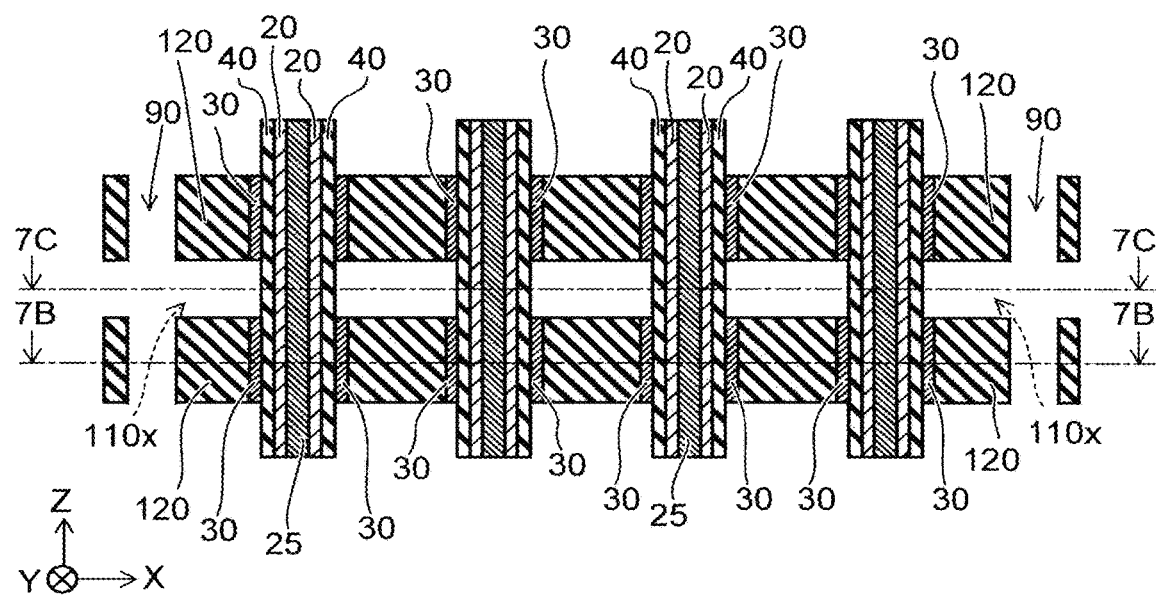
Figure 7B:
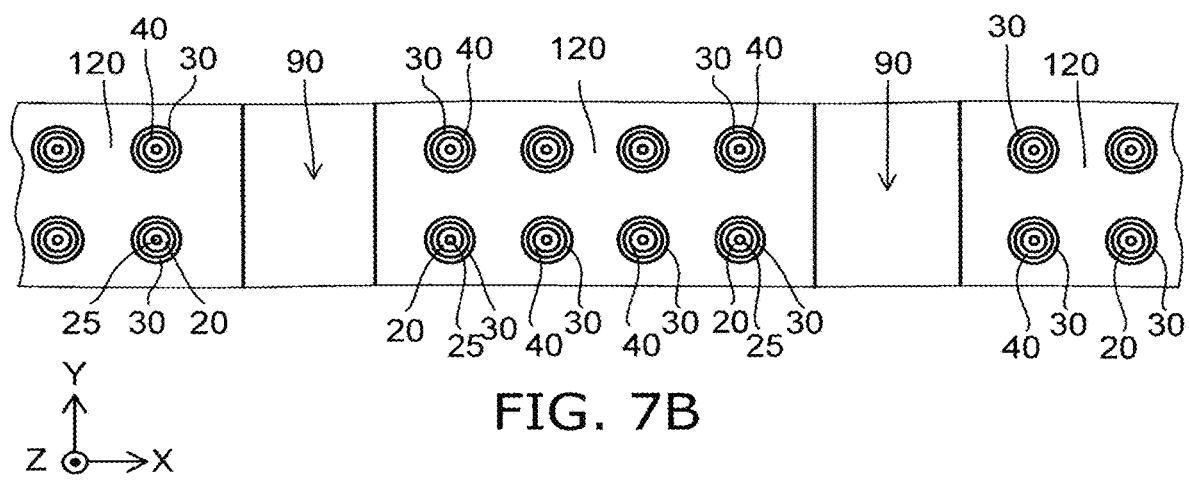
Figure 7C:
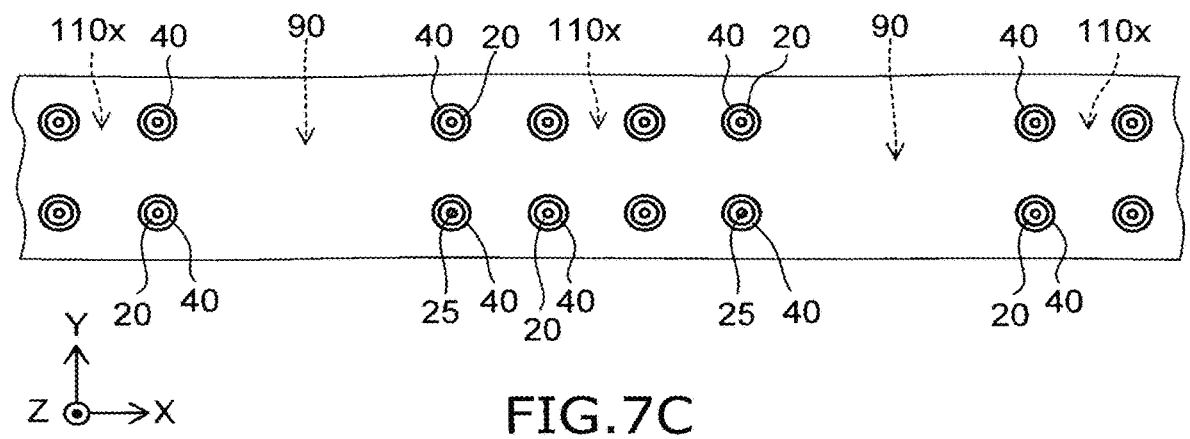

As shown in FIGS. 7A to 7C, the second portion 130b of the conductive film 130 exposed to the space 110x is etched to expose the first insulating film 40. FIG. 7B is a cross-sectional view taken along the line 7B-7B shown in FIG. 7A. FIG. 7C is a cross-sectional view taken along the line 7C-7C shown in FIG. 7A.

For example, by using etching conditions in which the polysilicon is etched, but the silicon nitride film and the silicon oxide film are not etched, the second portion 130b is selectively etched. The polysilicon can be selectively removed by, for example, CDE or an alkaline chemical solution. In the case where a metal film or a metal oxide film is used as the conductive film 130, the conductive film 130 can be selectively removed by using, for example, an acidic chemical solution or CDE. Further, in the case where ruthenium oxide is used for the conductive film 130, the conductive film 130 can be selectively removed by, for example, oxygen ashing.

By doing this, the first insulating film 40 is exposed to the inside of the space 110x. The conductive film 130 is separated into a plurality of conductive layers 30 separated from each other in the Z-direction. The conductive layer 30 is the first portion 130a of the conductive film 130, and is located between the second sacrifice film 120 and the first insulating film 40.

Further, by the above-described etching, the conductive layer 30 is formed such that the length of the first face 30a in contact with the first insulating film 40 in the Z-direction is longer than the length of the second face 30b in contact with the second insulating film 50 in the Z-direction (See FIG. 2).

Figure 8A:
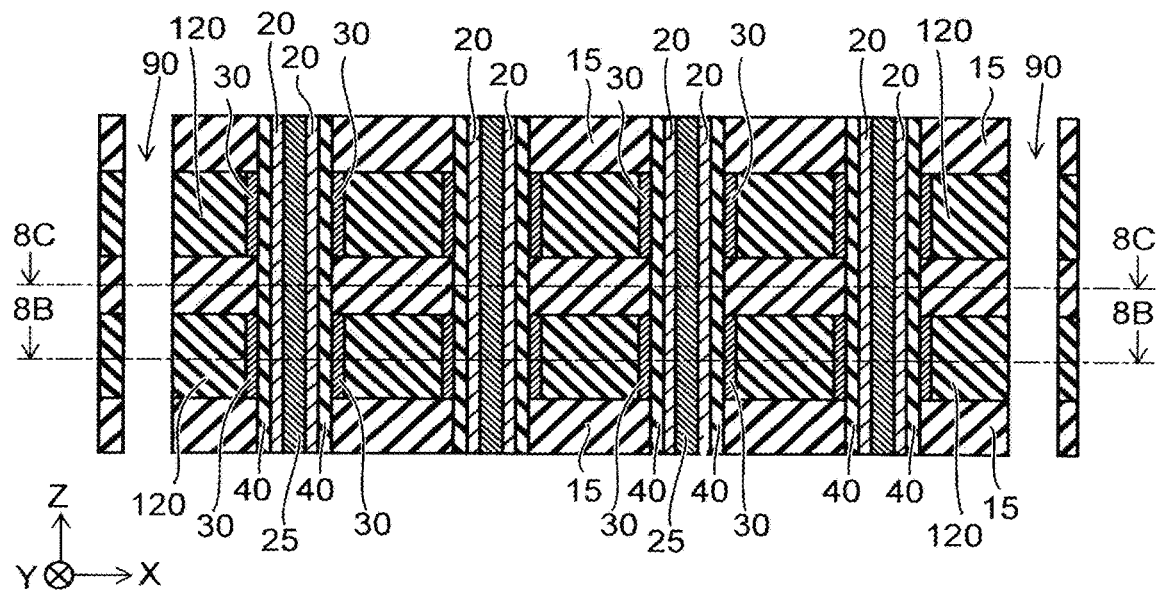
Figure 8B:
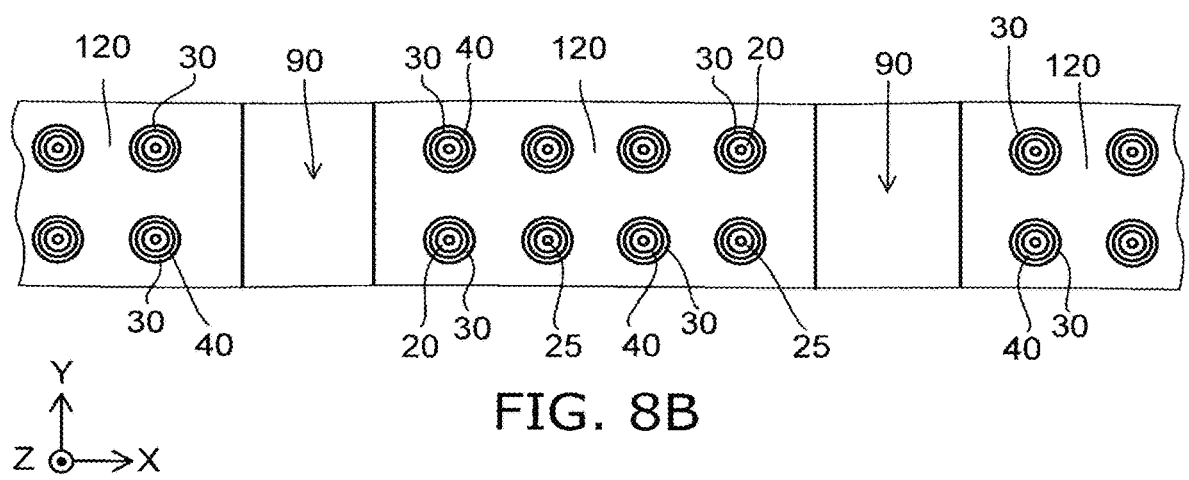
Figure 8C:
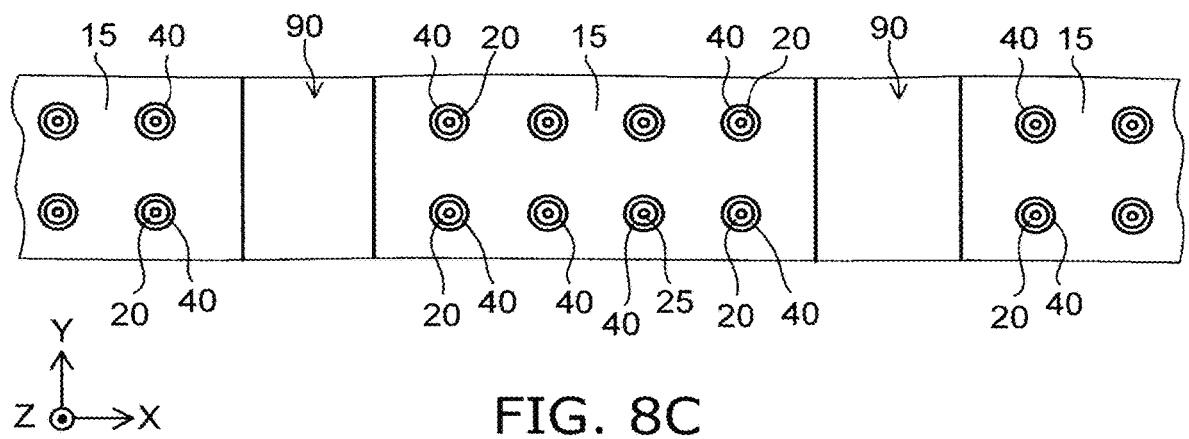

As shown in FIGS. 8A to 8C, the interlayer insulating film 15 is formed inside the space 110x. FIG. 8B is a cross-sectional view taken along the line 8B-8B shown in FIG. 8A. FIG. 8C is a cross-sectional view taken along the line 8C-8C shown in FIG. 8A.

As the interlayer insulating film 15, for example, a silicon oxide film can be used. The interlayer insulating film 15 can be formed by using, for example, CVD. Specifically, a silicon oxide film is deposited inside the space 110x by supplying a raw material gas thereto through the slit 90.

Figure 9A:
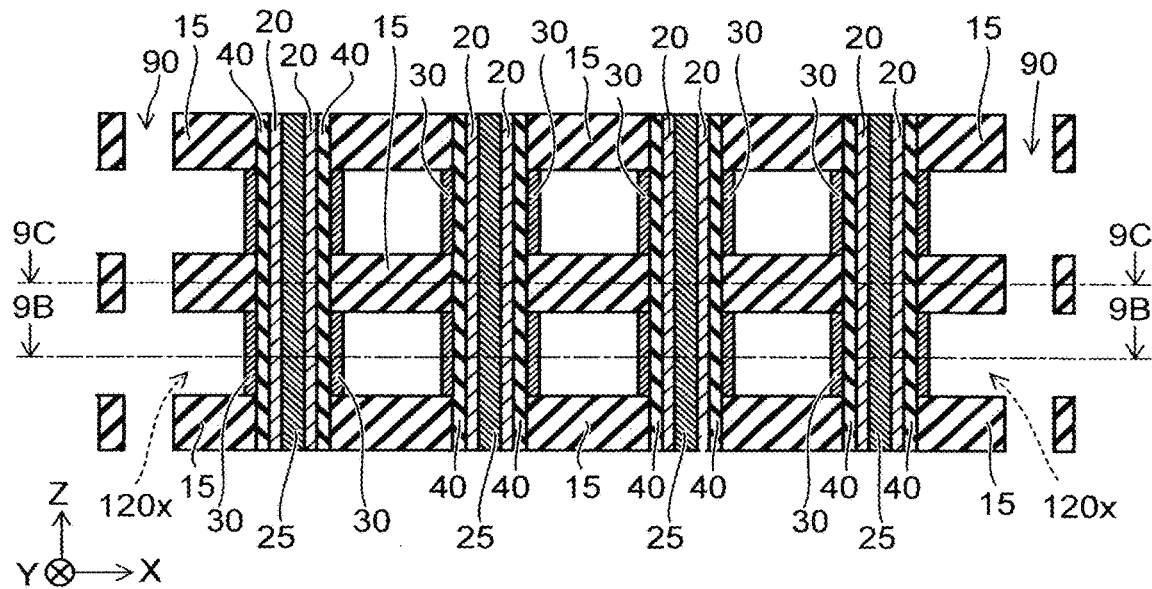
Figure 9B:
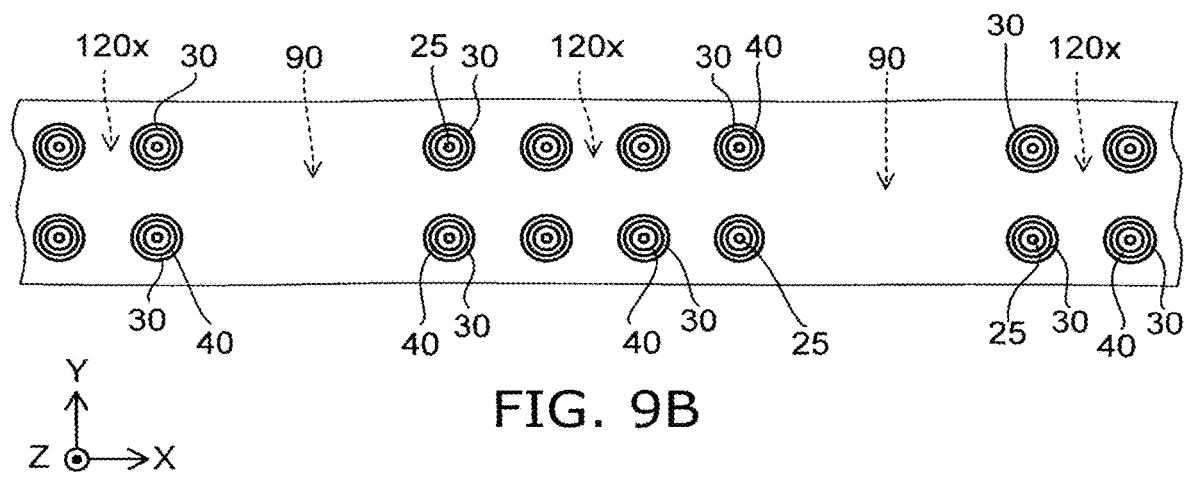
Figure 9C:
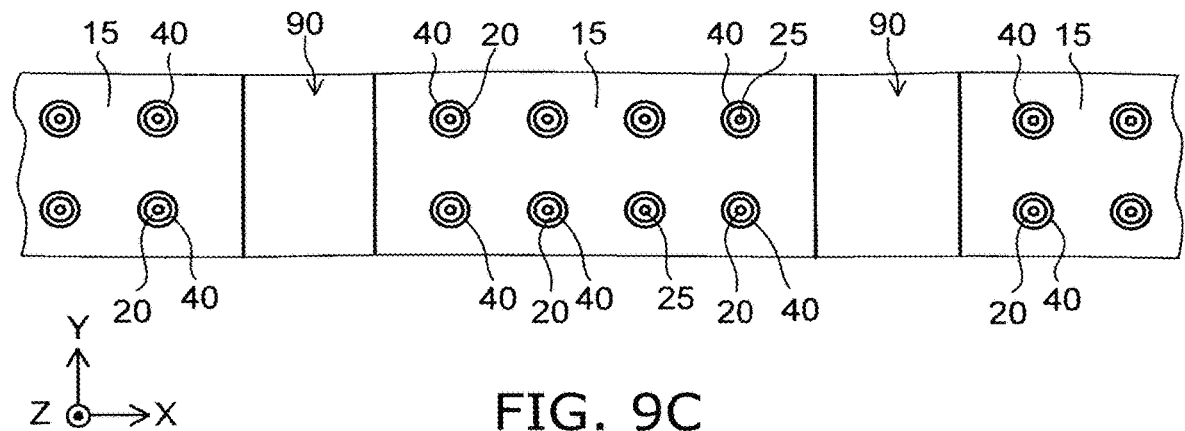

As shown in FIGS. 9A to 9C, the second sacrifice film 120 is selectively removed through the slit 90. FIG. 9B is a cross-sectional view taken along the line 9B-9B shown in FIG. 9A. FIG. 9C is a cross-sectional view taken along the line 9C-9C shown in FIG. 9A. As shown in FIGS. 9A and 9B, the conductive layer 30 is exposed to a space 120x where the second sacrifice film 120 is removed.

For example, as the second sacrifice film 120, a silicon nitride film is used. In the inner wall of the memory hole 17, the conductive layer 30 in contact with the second sacrifice film 120 is, for example, a polysilicon film. Further, the interlayer insulating film 15 is a silicon oxide film. Therefore, the second sacrifice film 120 can be selectively removed with respect to the interlayer insulating film 15 and the conductive layer 30 by, for example, wet etching using hot phosphoric acid. Further, the second sacrifice film 120 may be selectively etched using CDE.

Figure 10A:
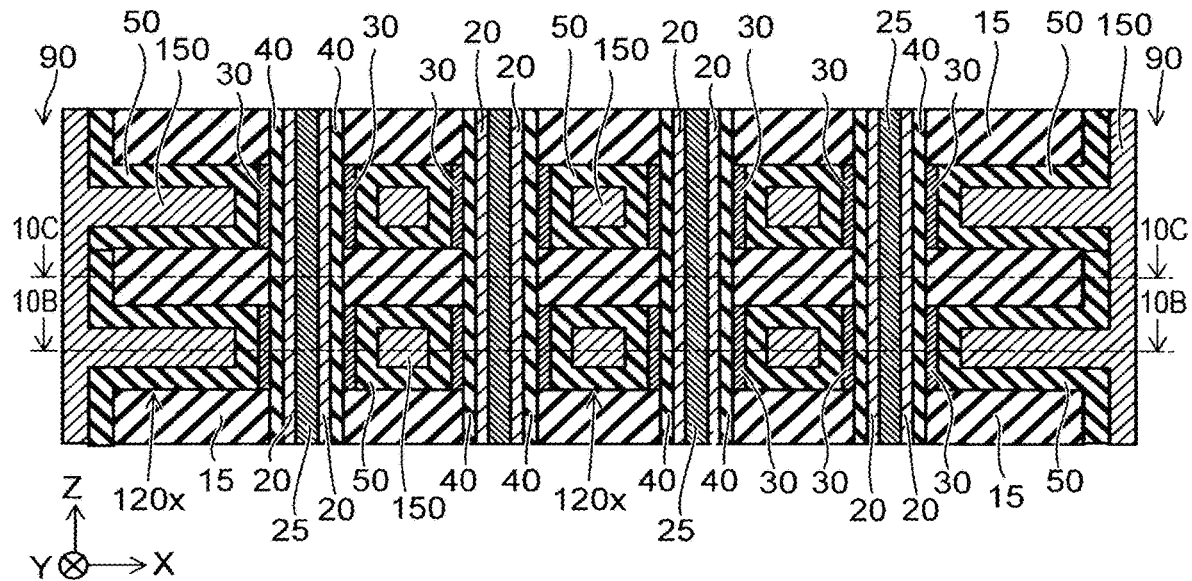
Figure 10B:
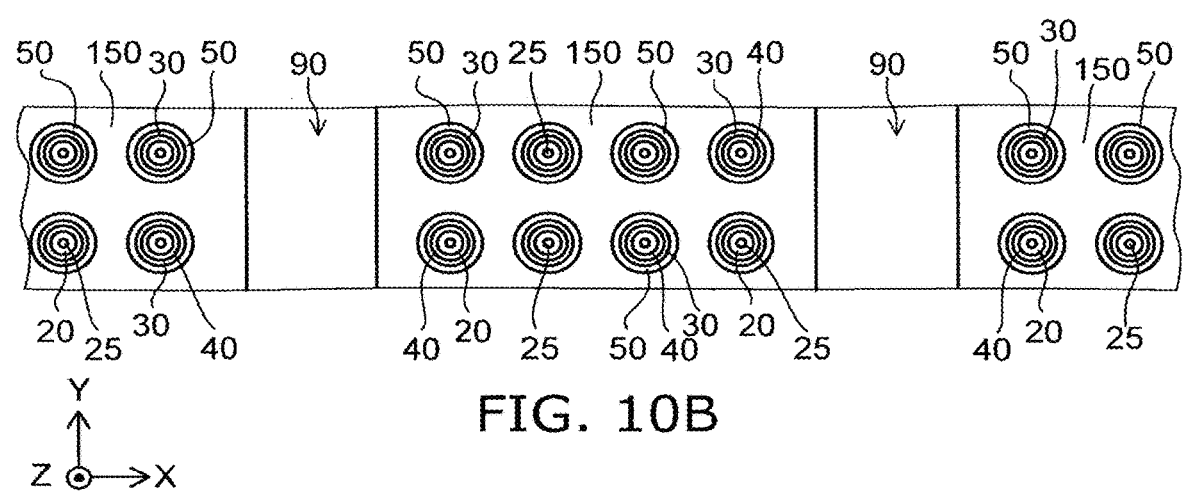
Figure 10C:
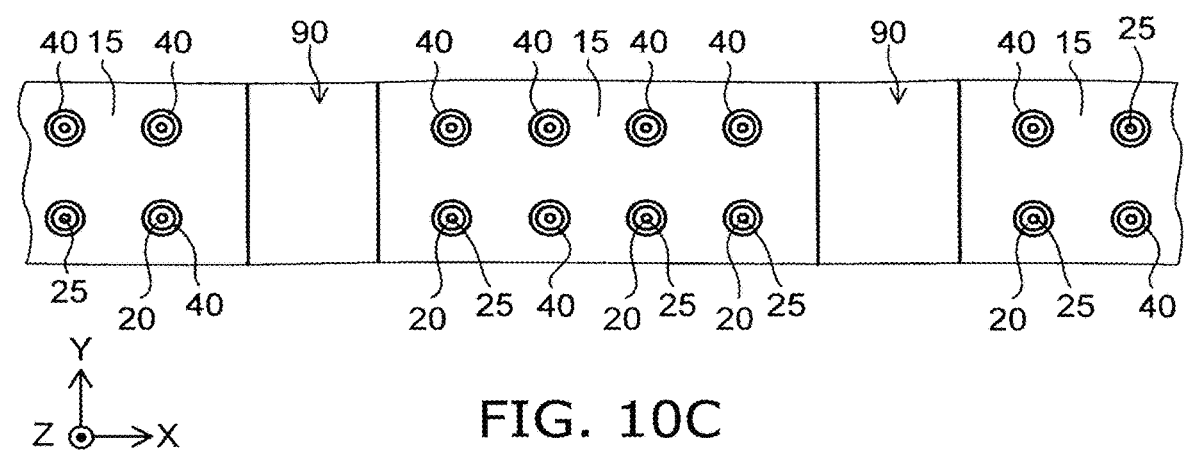

As shown in FIGS. 10A to 10C, the second insulating film 50 and an electrode layer 150 are formed in the space 120x where the second sacrifice film 120 is removed. FIG. 10B is a cross-sectional view taken along the line 10B-10B shown in FIG. 10A. FIG. 10C is a cross-sectional view taken along the line 10C-10C shown in FIG. 10A.

The second insulating film 50 is formed inside the space 120x. Then, on the second insulating film 50, the electrode layer 150 is formed. The second insulating film 50 is in contact with the conductive layer 30. The electrode layer 150 is formed, for example, so as to fill the space 120x therewith.

The second insulating film 50 includes an oxide containing at least one element selected from, for example, silicon, zirconium, hafnium, tantalum, lanthanum, and aluminum. The second insulating film 50 may include an oxynitride containing at least one element selected from silicon, zirconium, hafnium, tantalum, lanthanum, and aluminum.

Further, the second insulating film 50 may have a stacked structure including an oxide containing at least one element selected from, for example, silicon, zirconium, hafnium, tantalum, lanthanum, and aluminum and an oxynitride containing at least one element selected from silicon, zirconium, hafnium, tantalum, lanthanum, and aluminum (see FIG. 2).

The electrode layer 150 includes, for example, tungsten. Further, the electrode layer 150 may have a stacked structure (see FIG. 2) including, for example, a titanium nitride (TiN) and tungsten.

The second insulating film 50 and the electrode layer 150 are formed by using, for example, a CVD method. Specifically, an insulating film and a metal film are deposited inside the space 120x by supplying raw material gases thereto through the slit 90.

Figure 11A:
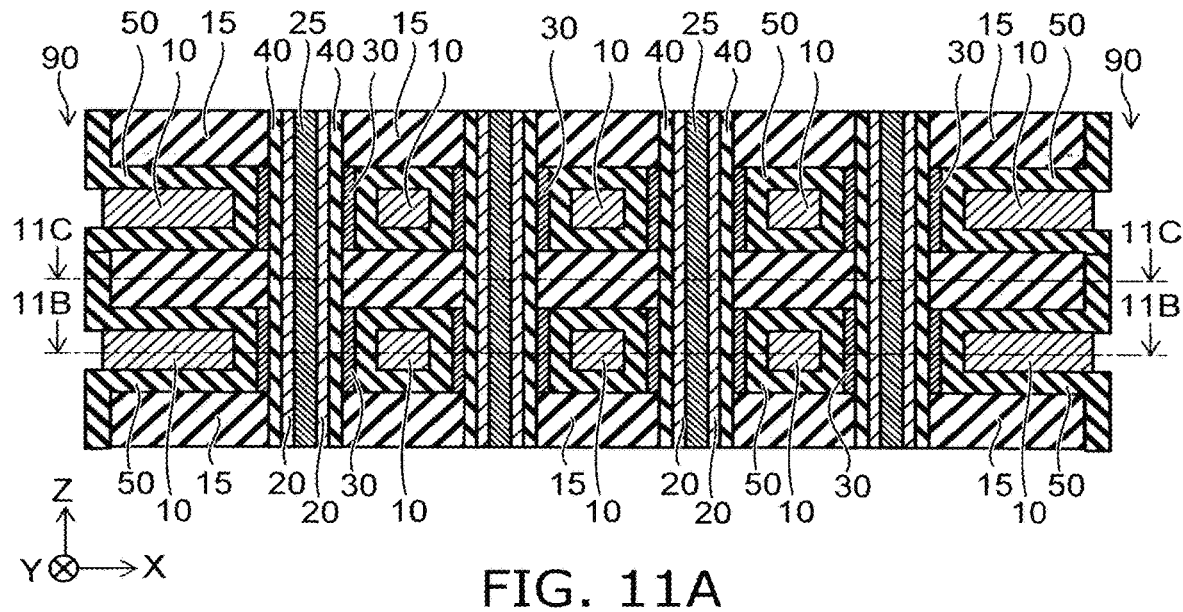
Figure 11B:
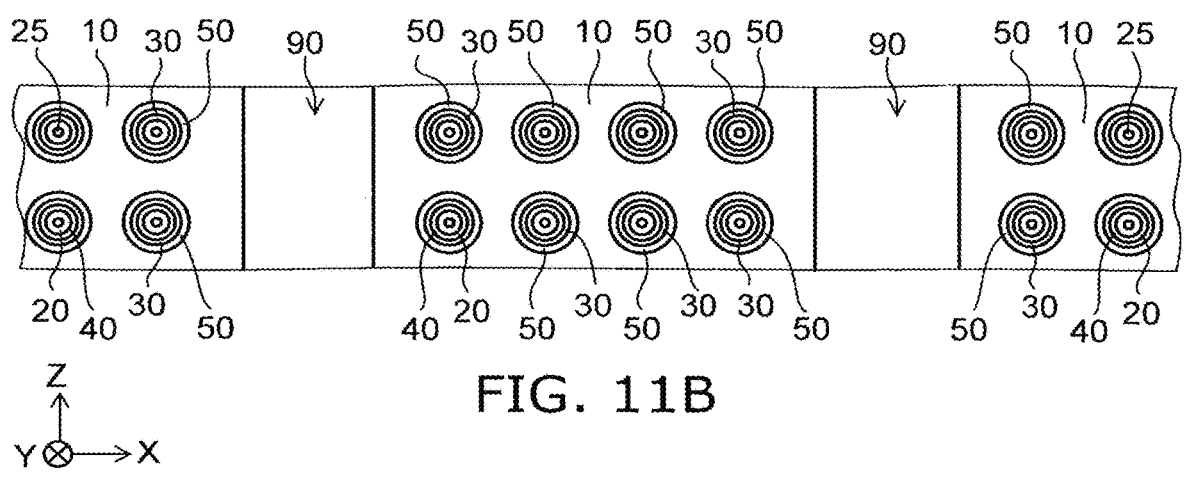
Figure 11C:
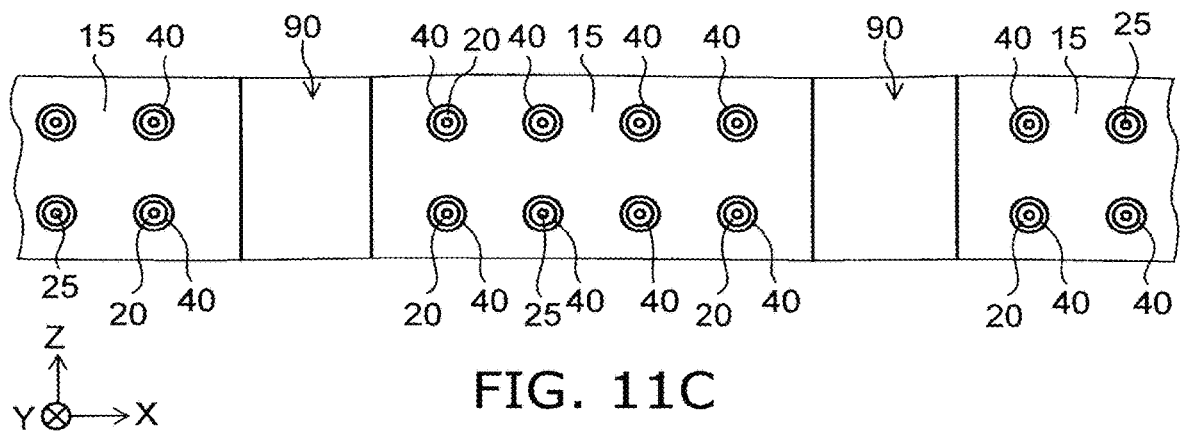

As shown in FIGS. 11A to 11C, the electrode layer 150 formed on the inner wall of the slit 90 is removed, and the control gates 10 arranged in the Z-direction are formed. FIG. 11B is a cross-sectional view taken along the line 11B-11B shown in FIG. 11A. FIG. 11C is a cross-sectional view taken along the line 11C-11C shown in FIG. 11A.

For example, by using RIE, a portion where the electrode layer 150 is formed on the inner wall of the slit 90 is removed. By doing this, the control gate 10 can be formed between the interlayer insulating films 15. The second insulating film 50 extends between the control gate 10 and the interlayer insulating film 15 adjacent to the control gate 10.

Subsequently, the selection transistor 70 is formed on the uppermost interlayer insulating film 15. Further, an interconnection layer 85 including the bit line 80 and the contact plug 81 is formed, whereby the non-volatile memory device 1 is completed (see FIG. 1).

Figure 12:
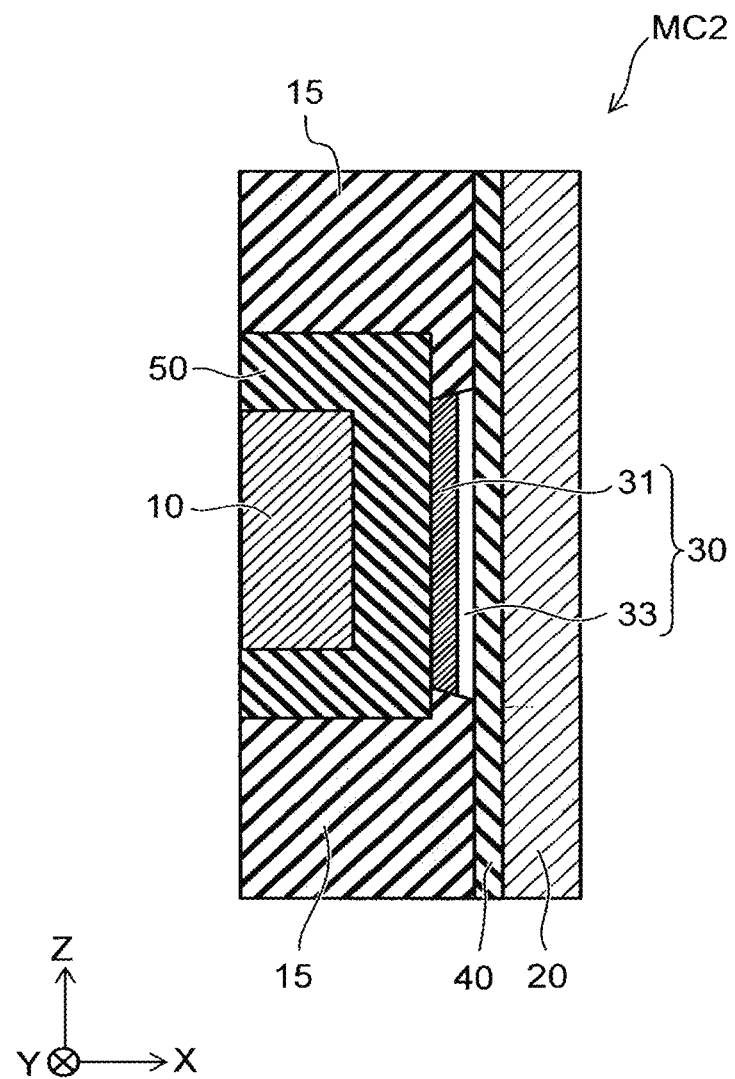
FIG. 12 is a schematic cross-sectional view showing a memory cell according to a variation of the first embodiment.

FIG. 12 is a schematic cross-sectional view showing a memory cell MC2 according to a variation of the first embodiment. In the memory cell MC2, the conductive layer 30 includes a first layer 31 and a second layer 33. The first layer 31 is located between the second layer 33 and the second insulating film 50. The second layer 33 is located between the first layer 31 and the first insulating film 40.

The first layer 31 is, for example, any one of a conductive film containing silicon, a metal film, and a conductive film containing a metal oxide. The second layer 33 includes a film different from the first layer 31 selected from a conductive film containing silicon, a metal film, and a conductive film containing a metal oxide.

Further, the first layer 31 is, for example, any one of a conductive film containing silicon, a metal film, and a conductive film containing a metal oxide. The second layer 33 includes a third insulating film. The energy band gap of the third insulating film is narrower than, for example, that of the first insulating film 40. For example, when a silicon oxide film is employed as the first insulating film 40, the third insulating film is a silicon nitride film.

According to the variation, by configuring the conductive layer 30 to have a stacked structure including two layers having a different electrical property, a charge holding property (retention property) can be improved.

Second Embodiment

FIGS. 13A to 13D are schematic cross-sectional views illustrating a process for manufacturing a non-volatile memory device according to a second embodiment. FIGS. 13A to 13D are, for example, cross-sectional views of a portion corresponding to the upper half of the region 2F shown in FIG. 1.

Figure 13A:
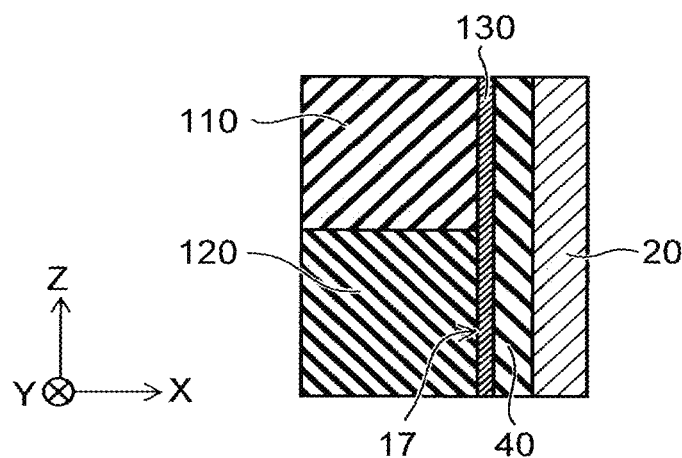
FIGS. 13A to 13D are schematic cross-sectional views illustrating a process for manufacturing a non-volatile memory device according to a second embodiment.

FIG. 13A shows a channel body 20, a first insulating film 40, and a conductive film 130 formed inside the memory hole 17. The conductive film 130 is in contact with a first sacrifice film 110 and a second sacrifice film 120. The first insulating film 40 is located between the channel body 20 and the conductive film 130.

Figure 13B:
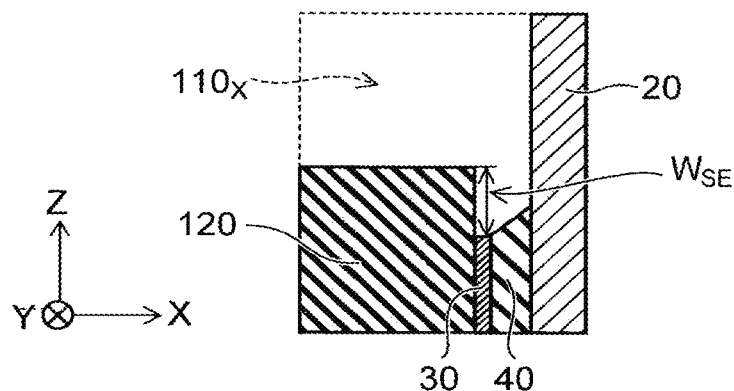

As shown in FIG. 13B, the first sacrifice film 110, a part of the conductive film 130, and a part of the first insulating film 40 are selectively removed, and a part of the channel body 20 is exposed. Specifically, the first sacrifice film 110 is selectively etched. Subsequently, the conductive film 130 exposed to a space 110x where the first sacrifice film 110 is removed is etched. Further, a part of the first insulating film 40 exposed after removing the conductive film 130 is also removed, whereby the channel body 20 is exposed.

By doing this, a conductive layer 30 which is a part of the conductive film 130 is formed between the channel body 20 and the second sacrifice film 120. Then, in this example, a side-etching amount $W_{SE}$ of the conductive film 130 can be made larger as compared with the case where a part of the first insulating film 40 is not etched.

Figure 13C:
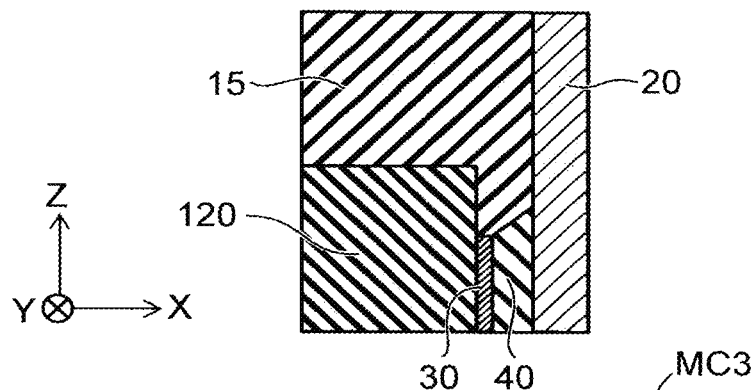

As shown in FIG. 13C, an interlayer insulating film 15 is formed in a space where the first sacrifice film 110, a part of the conductive film 130, and a part of the first insulating film 40 are selectively removed. The interlayer insulating film 15 is, for example, a silicon oxide film, and is formed by using a CVD method. The interlayer insulating film 15 is in contact with the channel body 20. Further, a space where the first insulating film 40 and the conductive film 130 between the channel body 20 and the second sacrifice film 120 are side-etched is filled with the interlayer insulating film 15.

Figure 13D:
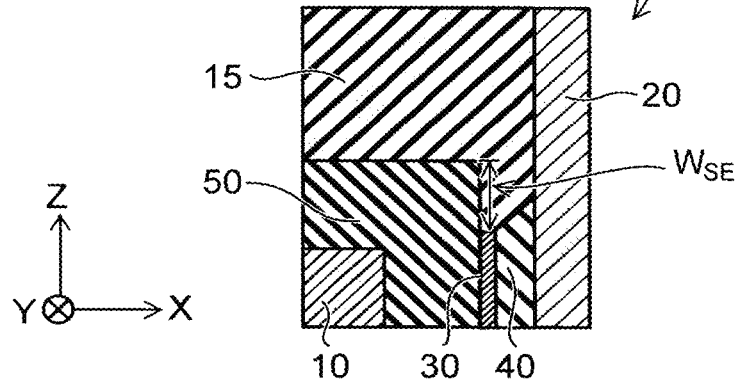

As shown in FIG. 13D, in a space where the second sacrifice film 120 is removed, a control gate 10 and a second insulating film 50 are formed. That is, the second sacrifice film 120 is selectively removed, and in a space thereafter, the second insulating film 50 and the control gate 10 are formed in this order.

In a memory cell MC3 shown in FIG. 13D, a plurality of the conductive layers 30 are provided so as to be separated from each other in the Z-direction. Further, the first insulating film 40 is also separated into a plurality of portions, and the portions are separated from each other in the Z-direction. Then, the interlayer insulating film 15 is in contact with the channel body 20 between the portions of the first insulating film.

In the memory cell MC3, the side-etching amount $W_{SE}$ of the conductive film 130 can be increased. Therefore, it is possible to decrease an interval between the edge of the conductive layer 30 in the Z-direction and the control gate 10. According to this configuration, the controllability of the charge at the edge portion of the conductive layer 30 can be improved.

Third Embodiment

Figure 14:
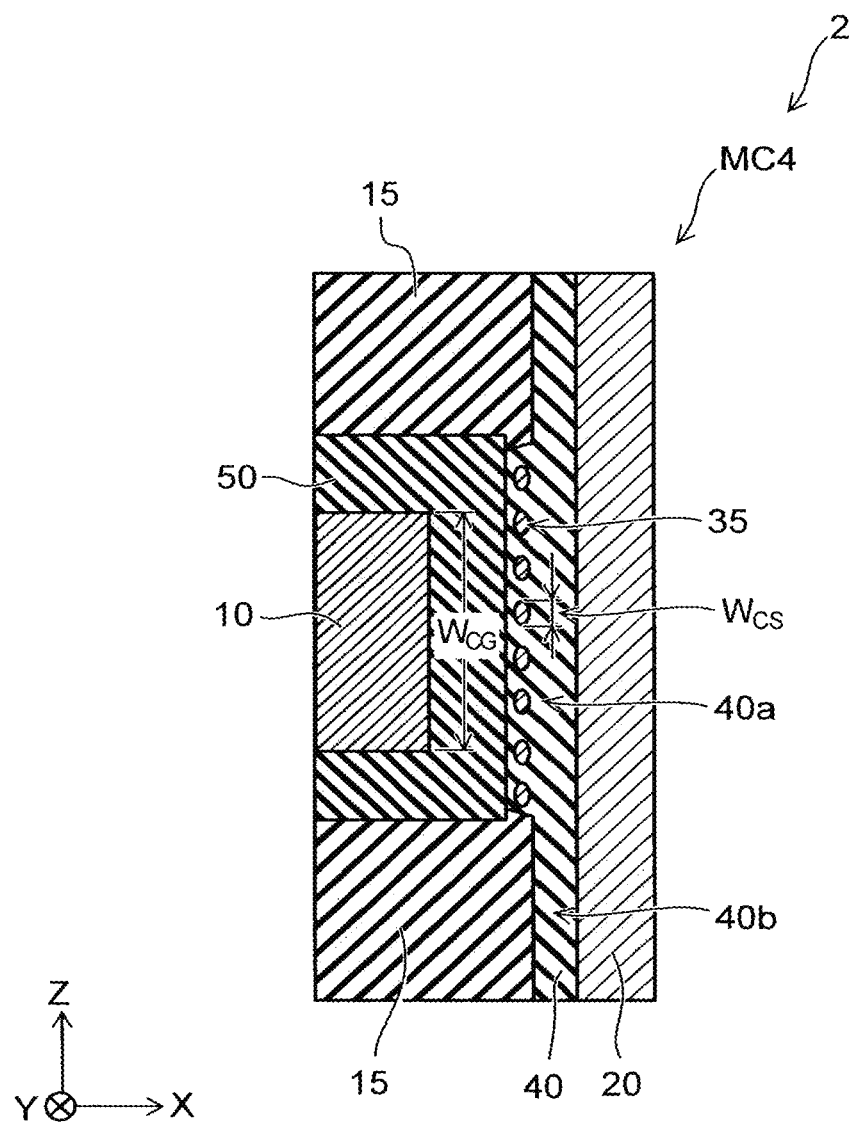
FIG. 14 is a schematic view illustrating a memory cell according to a third embodiment.

FIG. 14 is a schematic view illustrating a memory cell MC4 of a non-volatile memory device 2 according to a third embodiment. FIG. 14 is, for example, a schematic cross-sectional view of a portion corresponding to the region 2F shown in FIG. 1.

As shown in FIG. 14, between a control gate 10 and a channel body 20, a plurality of conductors 35, a first insulating film 40, and a second insulating film 50 are disposed. The conductors 35 are provided in a size such that the length $W_{CS}$ thereof in the Z-direction is smaller than the width $W_{CG}$ of the control gate 10 in the Z-direction. The conductors 35 are arranged in the Z-direction along the second insulating film 50. Further, the conductors 35 may be in contact with the second insulating film 50.

For example, the conductors 35 each have a size of less than 3 nm, and at least two or more different sizes are included. The conductors 35 are, for example, silicon, a metal, or a metal oxide.

Between the control gate 10 and the channel body 20, a floating gate type memory cell MC1 including the conductors 35, the first insulating film 40, and the second insulating film 50 is formed. The conductors 35 function, for example, as a charge storage layer. The first insulating film 40 functions, for example, as a tunnel insulating film. The second insulating film 50 functions, for example, as a block insulating film.

Each conductor 35 is, for example, formed into the shape of an island or a dot having a size in the Z-direction smaller than the width of the control gate 10. The first insulating film 40 covers the conductors 35. According to this configuration, charge transfer between the conductors 35 is prevented so that the retention property can be improved.

Between the control gates, the interlayer insulating film 15 is provided. The first insulating film 40 includes a first portion 40a and a second portion 40b. The first portion 40a is located between the channel body 20 and the conductors 35. The second portion is located between the interlayer insulating film 15 and the channel body 20.

The thickness of the first portion 40a in a direction perpendicular to the Z-direction is larger than the thickness of the second portion 40b in the direction perpendicular to the Z-direction. The "direction perpendicular to the Z-direction" as used herein refers to, for example, a direction toward the control gate 10 from the channel body 20.

Next, with reference to FIGS. 15A to 15D, a method for manufacturing the non-volatile memory device 2 according to the third embodiment will be described. FIGS. 15A to 15D are schematic views illustrating a process for manufacturing the non-volatile memory device 2. FIGS. 15A to 15D are, for example, cross-sectional views of a portion corresponding to the upper half of the region 2F shown in FIG. 1.

Figure 15A:
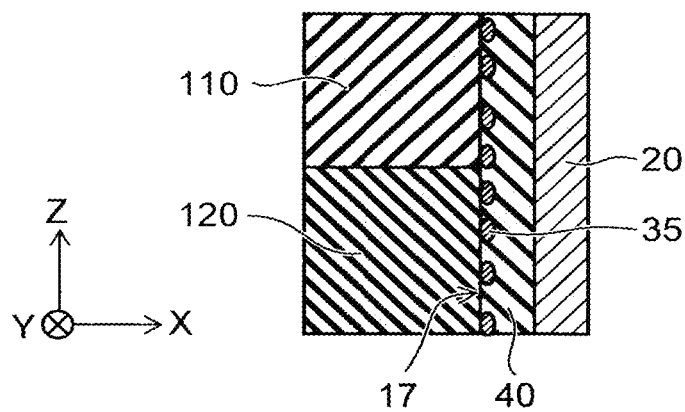
FIGS. 15A to 15D are schematic views illustrating a process for manufacturing the non-volatile memory device according to a third embodiment.

FIG. 15A shows the channel body 20, the conductors 35, and the first insulating film 40 formed inside the memory hole 17.

The conductors 35 are arranged in the Z-direction along the first sacrifice film 110 and the second sacrifice film 120. The conductors 35 are, for example, a metal, and are formed by using a CVD method. For example, in the case where a metal is deposited on the inner wall of the memory hole 17 by using a CVD method, in the initial process thereof, the metal is deposited as fine particles in the form of islands or dots. By stopping the deposition of the metal at this stage, the conductors 35 can be formed on the inner wall of the memory hole 17. The size of each of the conductors 35 which are metal fine particles is, for example, less than 3 nm.

Subsequently, on the inner wall of the memory hole 17 with the conductors 35 formed thereon, the first insulating film 40 is formed. The first insulating film is, for example, a silicon oxide film, and can be formed by using a CVD method. The first insulating film 40 is formed so as to cover the conductors 35. Further, on the first insulating film 40, the channel body 20 is formed. The channel body 20 is, for example, a polysilicon film.

Figure 15B:
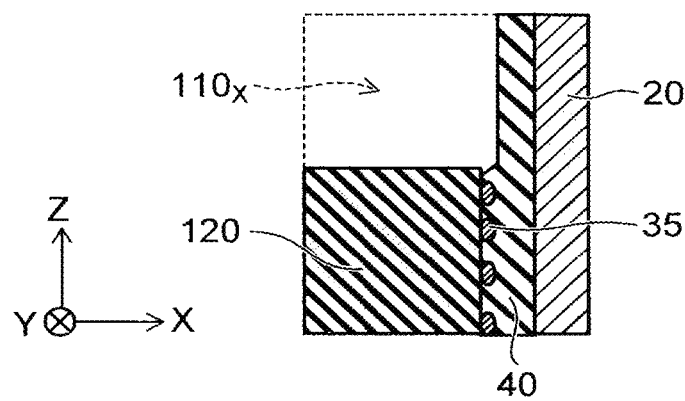

As shown in FIG. 15B, the first sacrifice film 110 and a part of the first insulating film 40 including the conductors 35 are removed. Specifically, the first sacrifice film 110 is selectively etched. Subsequently, the first insulating film 40 including the conductors 35 exposed to a space 110x where the first sacrifice film 110 is removed is etched.

Figure 15C:
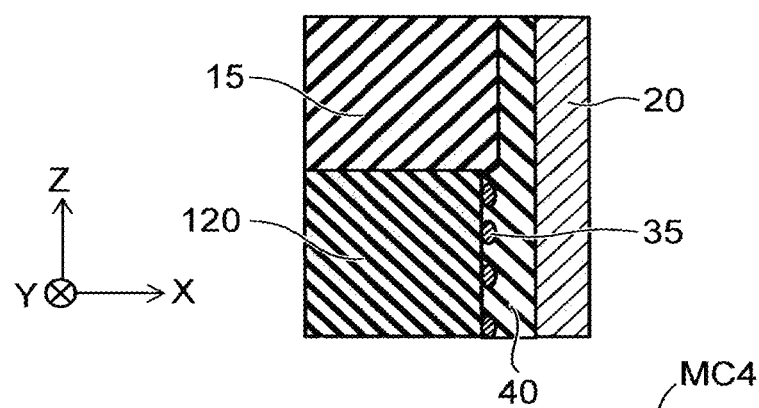

As shown in FIG. 15C, the interlayer insulating film 15 is formed in a space where the first sacrifice film 110 and a part of the first insulating film 40 are removed. The interlayer insulating film 15 is, for example, a silicon oxide film, and is formed by using a CVD method.

Figure 15D:
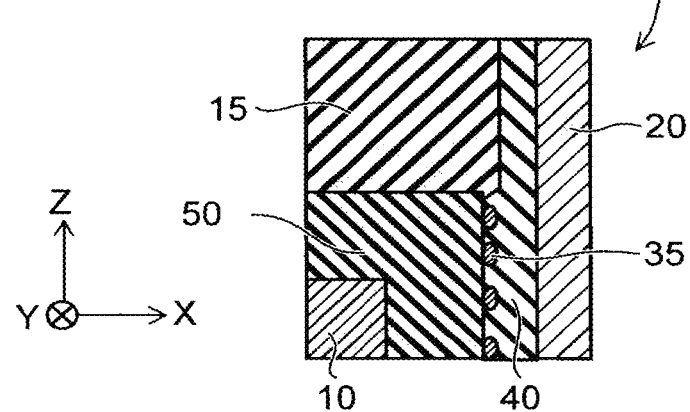

As shown in FIG. 15D, in a space where the second sacrifice film 120 is removed, the control gate 10 and the second insulating film 50 are formed. That is, the second sacrifice film 120 is selectively removed, and in a space thereafter, the second insulating film 50 and the control gate 10 are formed in this order.

In the memory cell MC4 shown in FIG. 15D, the conductors 35 are located between the first insulating film 40 and the second insulating film 50. The conductors 35 are in contact with the second insulating film 50. The conductors 35 are not interposed between the interlayer insulating film 15 and the first insulating film 40. The first insulating film 40 between the interlayer insulating film 15 and the channel body 20 is etched in the process shown in FIG. 15B, and therefore is thinner than a portion thereof located between the channel body 20 and the second insulating film 50.

Figure 16:
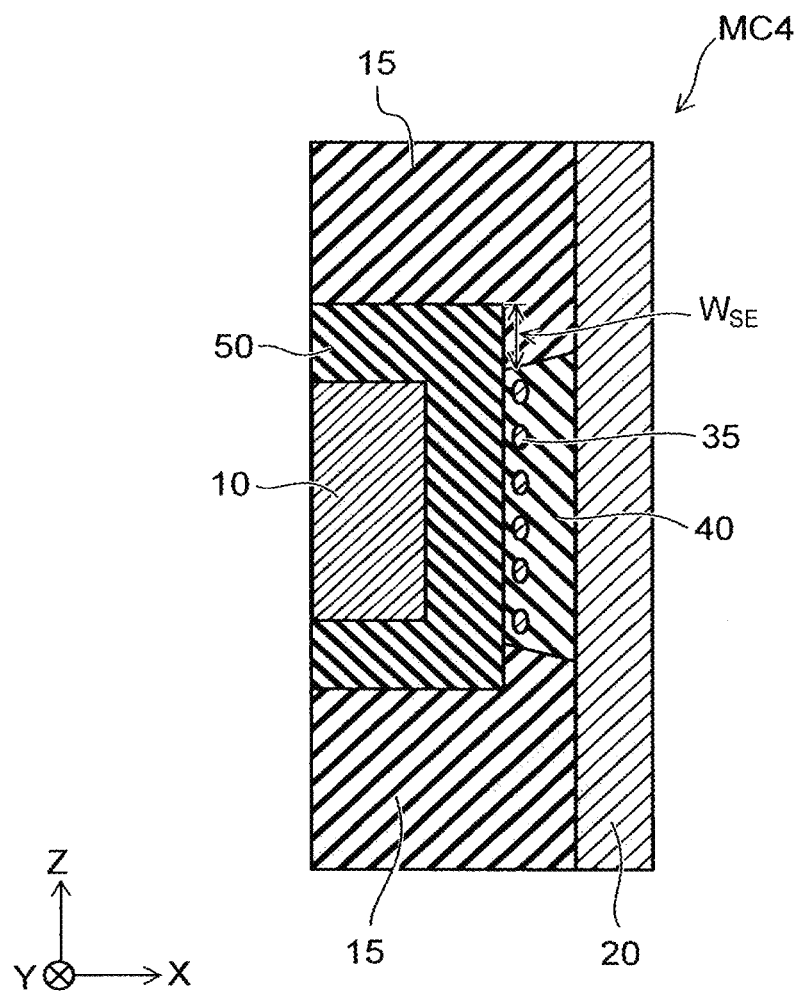
FIG. 16 is a schematic cross-sectional view showing a memory cell according to a variation of the third embodiment.

FIG. 16 is a schematic cross-sectional view showing the memory cell MC4 according to a variation of the third embodiment. The memory cell MC4 has the first insulating film 40 between the channel body 20 and the second insulating film 50. The first insulating film 40 includes the conductors 35 located on the side of the second insulating film 50. The first insulating films 40 are provided so as to be separated from each other in the Z-direction.

In a process for manufacturing the memory cell MC4, in the process for etching the first insulating film 40 including the conductors 35 (see FIG. 15B), an etching amount is increased so as to expose the channel body 20. Due to this, a side-etching amount $W_{SE}$ of the first insulating film 40 is increased. Therefore, in the memory cell MC4, for example, the conductors 35 can be disposed only between the control gate 10 and the channel body 20. According to this configuration, the controllability of the charge stored in the conductors 35 can be improved.

Hereinabove, the first to third embodiments are described, however, the embodiments are not limited thereto. Further, the embodiments can be carried out by mutually exchanging the constituent elements common to the respective embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
a plurality of memory cells stacked in a first direction and electrically connected in series; and
a selection transistor provided above the memory cells,
at least one of the memory cells including:
a control gate electrode;
a first channel extending in the first direction through the control gate electrode;
a first insulating core film provided inside the first channel;
a charge storage portion including a conductor provided between the control gate electrode and the first channel;
a first insulating film provided between the charge storage portion and the first channel; and
a second insulating film provided between the control gate electrode and the charge storage portion,
a width of the conductor in the first direction being narrower than a width of the control gate electrode in the first direction and a width of the second insulating film in the first direction,
the control gate electrode surrounding an outer periphery of the charge storage portion via the second insulating film in a plane perpendicular to the first direction,
respective control gate electrodes of the memory cells being alternately arranged with a plurality of interlayer insulating films in the first direction, and
the first insulating film being further provided between the interlayer insulating films and the first channel extending through the interlayer insulating films,
the selection transistor including:
a selection gate electrode; and
a second channel extending in the first direction through the selection gate electrode, the second channel being connected to one end of the first channel and not overlapping with the control gate electrode when projected from the first direction.

2. The device according to claim 1, further comprising a source layer provided below the memory cells.

3. The device according to claim 2, wherein another end of the first channel is electrically connected to the source layer.

4. The device according to claim 1, wherein
the first channel is provided inside a first hole piercing the control gate electrodes and the interlayer insulating films alternately arranged, and
the first insulating film extends in the first direction along the first channel.

5. The device according to claim 4, wherein
the second channel is provided inside a second hole piercing the selection gate electrode, and
a dimension of the second hole is different from that of the first hole in a direction perpendicular to the first direction.

6. The device according to claim 1, wherein
the selection gate electrode is provided to oppose the second channel in a direction perpendicular to the first direction, and
a gate insulating film is provided between the selection gate electrode and the second channel, any conductive layer being not provided between the selection gate electrode and the second channel.

7. The device according to claim 1, wherein
a width of the selection gate electrode in the first direction is larger than a width of the control gate electrode in the first direction.

8. The device according to claim 1, wherein
a position of the second channel is shifted from that of the first channel in a direction perpendicular to the first direction.

9. The device according to claim 1, wherein
the selection transistor further includes a second insulating core film provided inside the second channel.

10. The device according to claim 1, wherein
the charge storage portion, the first insulating film and the first channel are provided concentrically when projected from the first direction.

11. A nonvolatile semiconductor memory device comprising:
a plurality of memory cells stacked in a first direction and electrically connected in series; and
a selection transistor provided above the memory cells,
at least one of the memory cells including:
a control gate electrode;
a first channel extending in the first direction through the control gate electrode;
a first insulating core film provided inside the first channel;
a charge storage portion including a conductor formed of silicon, the charge storage portion being provided between the control gate electrode and the first channel;
a first insulating film provided between the charge storage portion and the first channel; and
a second insulating film provided between the control gate electrode and the charge storage portion,
a width of the conductor in the first direction being narrower than a width of the control gate electrode in the first direction,
the control gate electrode surrounding an outer periphery of the charge storage portion via the second insulating film in a plane perpendicular to the first direction,
respective control gate electrodes of the memory cells being alternately arranged with a plurality of interlayer insulating films in the first direction, and
the first insulating film being further provided between the interlayer insulating films and the first channel extending through the interlayer insulating films,
the selection transistor including:
a selection gate electrode; and
a second channel extending in the first direction through the selection gate electrode, the second channel being connected to one end of the first channel and not overlapping with the control gate electrode when projected from the first direction.

12. The device according to claim 11, further comprising a source layer provided below the memory cells.

13. The device according to claim 12, wherein another end of the first channel is electrically connected to the source layer.

14. The device according to claim 11, wherein
the first channel is provided inside a first hole piercing the control gate electrodes and the interlayer insulating films alternately arranged, and
the first insulating film extends in the first direction along the first channel.

15. The device according to claim 14, wherein
the second channel is provided inside a second hole piercing the selection gate electrode, and a dimension of the second hole is different from that of the first hole in a direction perpendicular to the first direction.

16. The device according to claim 11, wherein
the selection gate electrode is provided to oppose the second channel in a direction perpendicular to the first direction, and
a gate insulating film is provided between the selection gate electrode and the second channel, any conductive layer being not provided between the selection gate electrode and the second channel.

17. The device according to claim 11, wherein
a width of the selection gate electrode in the first direction is larger than a width of the control gate electrode in the first direction.

18. The device according to claim 11, wherein
a position of the second channel is shifted from that of the first channel in a direction perpendicular to the first direction.

19. The device according to claim 11, wherein
the selection transistor further includes a second insulating core film provided inside the second channel.

20. The device according to claim 11, wherein
the charge storage portion, the first insulating film and the first channel are provided concentrically when projected from the first direction.

* * * * *